United States Patent
Dairiki et al.

(10) Patent No.: US 8,619,003 B2
(45) Date of Patent: Dec. 31, 2013

(54) SEMICONDUCTOR DEVICE WITH WIRELESS COMMUNICATION

(75) Inventors: Koji Dairiki, Kanagawa (JP); Konami Izumi, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 1201 days.

(21) Appl. No.: 12/053,932

(22) Filed: Mar. 24, 2008

(65) Prior Publication Data

US 2012/0146240 A1 Jun. 14, 2012

(30) Foreign Application Priority Data

Mar. 26, 2007 (JP) ................................. 2007-079190

(51) Int. Cl.
| | |
|---|---|
| H01Q 21/00 | (2006.01) |
| H01Q 1/38 | (2006.01) |
| H01Q 5/00 | (2006.01) |
| H01Q 9/04 | (2006.01) |
| H01L 23/34 | (2006.01) |
| H01L 23/48 | (2006.01) |
| H01L 23/52 | (2006.01) |
| H01L 29/40 | (2006.01) |
| H01L 23/58 | (2006.01) |

(52) U.S. Cl.
USPC ........... 343/893; 257/723; 257/724; 257/728; 257/777; 257/798; 257/E29.167; 257/E23.01; 257/E23.141; 343/700 MS; 343/800; 343/895

(58) Field of Classification Search
USPC .................. 257/678, 728, 786, 798, E29.167, 257/E23.01, E23.141, 686, 723, 724, 725, 257/777; 343/800, 700 MS, 893, 895
See application file for complete search history.

(56) References Cited

U.S. PATENT DOCUMENTS

| | | | |
|---|---|---|---|
| 7,106,079 B2 | 9/2006 | Drost et al. | |
| 7,262,622 B2 | 8/2007 | Zhao | |
| 7,295,029 B2 | 11/2007 | Zhao | |
| 7,309,865 B2 | 12/2007 | Ikushima et al. | |
| 7,495,462 B2 | 2/2009 | Hua et al. | |
| 7,768,790 B2 | 8/2010 | Kuroda et al. | |
| 8,190,086 B2 | 5/2012 | Sasaki et al. | |
| 2001/0000659 A1* | 5/2001 | Hayashi et al. | 340/10.34 |

(Continued)

FOREIGN PATENT DOCUMENTS

| | | |
|---|---|---|
| DE | 29 02 002 A1 | 7/1980 |
| EP | 1 650 801 A2 | 4/2006 |

(Continued)

OTHER PUBLICATIONS

Search Report (European Patent Application No. 08005048.7) mailed Oct. 6, 2008.

*Primary Examiner* — Teresa M Arroyo
(74) *Attorney, Agent, or Firm* — Fish & Richardson P.C.

(57) ABSTRACT

To provide a semiconductor device in which wireless communication is performed between devices formed over different substrates and connection defects of wirings are reduced. A first device having a first antenna is provided over a first substrate, a second device having a second antenna which can communicate with the first antenna is provided over a second substrate, and the first substrate and the second substrate are bonded to each other to manufacture a semiconductor device. The first substrate and the second substrate are bonded to each other by bonding with a bonding layer interposed therebetween, anodic bonding, or surface activated bonding.

14 Claims, 22 Drawing Sheets

(56) References Cited

U.S. PATENT DOCUMENTS

| | | |
|---|---|---|
| 2005/0200537 A1* | 9/2005 | Jarmuszewski et al. ...... 343/702 |
| 2006/0001572 A1* | 1/2006 | Gaucher et al. .............. 343/701 |
| 2006/0087332 A1 | 4/2006 | Drost et al. |
| 2006/0092079 A1* | 5/2006 | de Rochemont ....... 343/700 MS |
| 2006/0131501 A1 | 6/2006 | Ikushima et al. |
| 2006/0267138 A1* | 11/2006 | Kobayashi .................... 257/531 |
| 2007/0046544 A1* | 3/2007 | Murofushi et al. .... 343/700 MS |
| 2007/0176845 A1* | 8/2007 | Yamazaki et al. ............ 343/895 |

FOREIGN PATENT DOCUMENTS

| | | |
|---|---|---|
| JP | 11-068033 A | 3/1999 |
| JP | 2003-298012 A | 10/2003 |
| JP | 2005-228981 A | 8/2005 |
| JP | 3808092 B2 | 8/2006 |
| JP | 2006-270098 A | 10/2006 |
| JP | 2006332576 A | 12/2006 |
| JP | 2007073812 A | 3/2007 |
| WO | 2007/029435 A1 | 3/2007 |

* cited by examiner

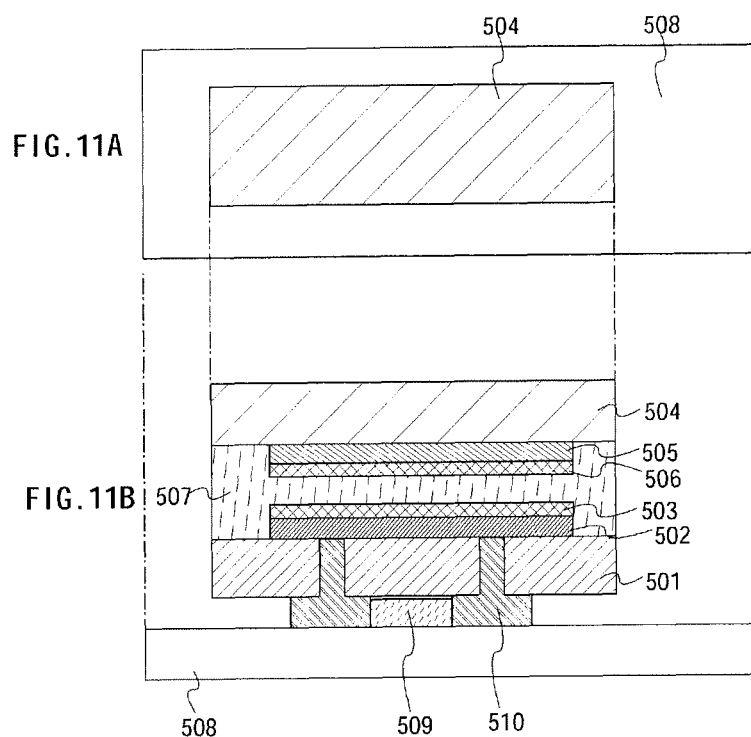

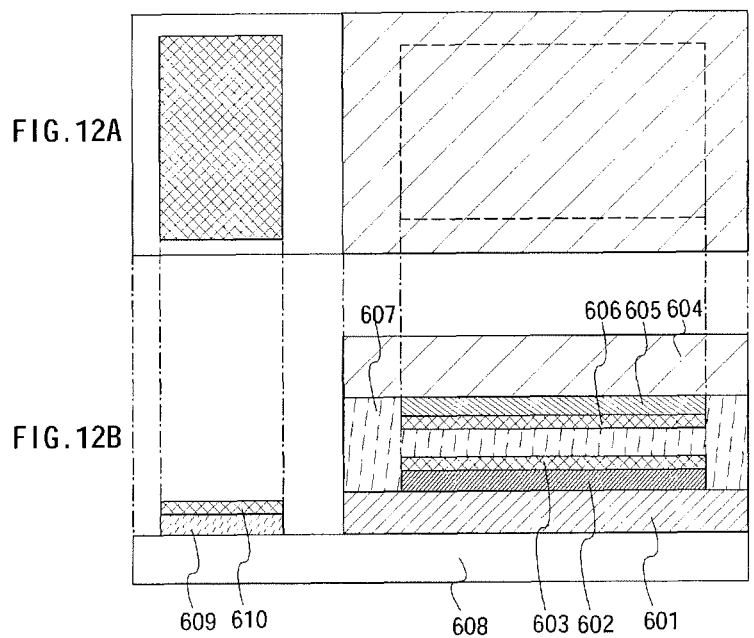

821A
832A 821B
832B 831
832
821
830

FIG.22(A-1)
FIG.22(A-2)
FIG.22(A-3)
FIG. 22B
FIG. 22C
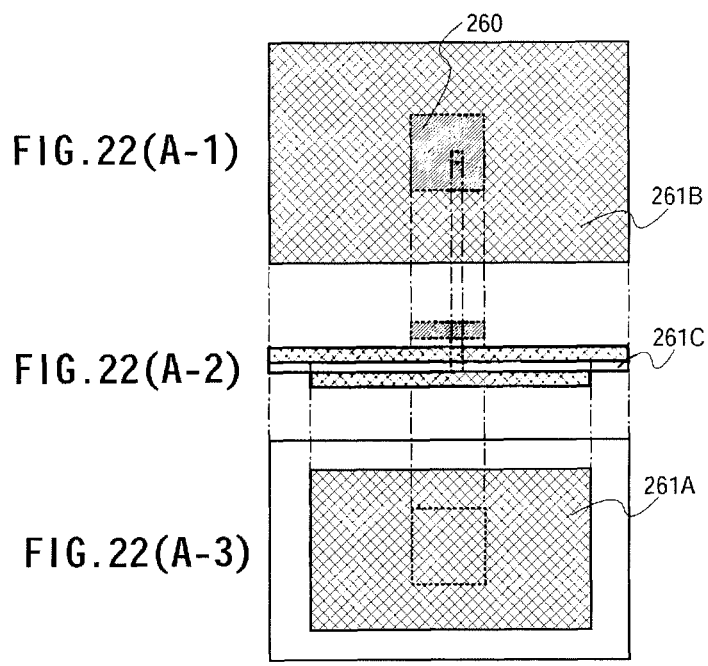
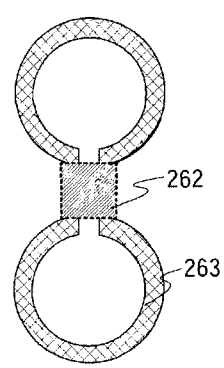
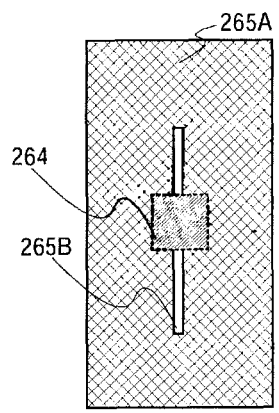

SEMICONDUCTOR DEVICE WITH WIRELESS COMMUNICATION

BACKGROUND OF THE INVENTION

1. Field of the Invention

The present invention relates to a semiconductor device.

2. Description of the Related Art

In recent years, a technique for achieving high integration of a semiconductor device by stacking element groups having a plurality of semiconductor elements manufactured using different substrates or mounting the element groups on the same package has been developed. As for such a semiconductor device, in a step of stacking the element groups or a step of mounting the element groups on the same package, it should be considered that an element which has been already formed is not damaged by heat, a chemical, or the like. As for manufacturing of a MEMS structure, transformation, deterioration, or the like due to heat, a chemical, or the like in a step of stacking element groups or a step of mounting element groups has been greatly problematic as a cause of decrease in yield. Note that here, an element group corresponds to a micro electro mechanical system (hereinafter referred to as a MEMS structure) manufactured using micromachining technology, and the like.

In addition, causes of decrease in yield are different between a MEMS structure manufactured using micromachining technology and a semiconductor integrated circuit which is manufactured by conventional technology for manufacturing an LSI and is provided around a MEMS structure. Therefore, in a micromachine having such a MEMS structure and a semiconductor integrated circuit, it is difficult to improve productivity because even if the micromachine is an on-chip type where the semiconductor integrated circuit and the MEMS structure are provided over the same substrate or an on-package type where the semiconductor integrated circuit and the MEMS structure are provided over different substrates and are mounted on the same package, yield thereof is the product of yield of the MEMS structure and yield of the semiconductor integrated circuit.

Nowadays, a MEMS structure and a semiconductor integrated circuit are often manufactured through different steps and are mounted using an on-package type. In order to electrically connect element groups manufactured over different substrates, wire bonding is commonly used and resin sealing is performed after connection.

In the case where a MEMS structure and a semiconductor integrated circuit are manufactured through different steps and are mounted by bonding substrates, it is difficult to seal a sealed space closely and to form a terminal for electric connection (for example, see Reference 1: Japanese Patent No. 3808092). Further, when a MEMS structure and a semiconductor integrated circuit are connected using a wiring, there has been a problem in that yield is decreased due to disconnection.

On the other hand, in the case where another element group (an antenna, a sensor, or the like) is mounted on a semiconductor integrated circuit, the biggest problem in reliability is fluctuation in impedance of a mounted portion. If the worst happens, impedance is opened.

SUMMARY OF THE INVENTION

It is an object of the present invention to realize excellent connection between a plurality of element groups in the case where the plurality of element groups provided over different substrates are mounted on one package.

A semiconductor device of the present invention includes a first substrate provided with a first element group and a second substrate provided with a second element group. The first element group includes a first antenna. The second element group includes a second antenna which communicates with the first antenna. The first substrate and the second substrate are bonded to each other. The first substrate and the second substrate may be bonded to each other with a bonding layer provided on part of or the entire surface of one of the first substrate and the second substrate interposed therebetween, or may be bonded to each other by anodic bonding or surface activated bonding. In addition, it is preferable that a depressed portion having a planar bottom surface be provided on one of the first substrate and the second substrate and the element group be provided on the bottom surface.

Alternatively, a third substrate (an intermediate substrate) may be provided between the first substrate and the second substrate. In this case, the first substrate and the third substrate (the intermediate substrate) are bonded to each other, and the second substrate and the third substrate (the intermediate substrate) are bonded to each other. Bonding between the substrates may be performed using anodic bonding or surface activated bonding.

Each of the first element group and the second element group may be a semiconductor integrated circuit having a thin film transistor or a field effect transistor, or may have a transducer or a microactuator.

In addition, as each of the first substrate and the second substrate, a single crystal silicon substrate, a silicon compound substrate, a compound semiconductor substrate, an SOI substrate, an alkali-free glass substrate, a soda glass substrate, a quartz substrate, a plastic substrate, or a metal substrate can be used.

Further, in the first substrate provided with the first element group and the second substrate provided with the second element group, surfaces on which the element groups are provided may face each other or it is not necessary to face each other.

Note that in this specification, a transducer corresponds to an element which converts thermal energy, optical energy, kinetic energy, electromagnetic energy, or the like into electric energy, an element which converts electric energy into another energy such as thermal energy, or the like, like a sensor or a generator. Further, a transducer also corresponds to an element which converts thermal energy, optical energy, or electric energy into kinetic energy, like a microactuator. Examples of a transducer are an optical sensor (a photo IC), a thermoelectric conversion element, an acceleration transducer having a movable structure, and the like. Examples of such an element are a strain resistor, a light-emitting element, and the like. In addition, examples of a microactuator are a MEMS mirror, a bimetal, a photosensitive material, a heat-shrinkable material, a thermoplastic material, a MEMS heater, a speaker, a GLV device, a MEMS switch, a micro motor, a micro fluid device, and the like.

In addition, one or a plurality of an optical sensor (a photo IC), a movable MEMS structure, a light-emitting diode, a photovoltaic element, a thermoelectric element, a strain resistor, a radio wave sensor, and the like may be included as a sensor. Note that in this specification, a transducer also corresponds to a solar cell or a generator such as a thermal power generator or a wind-power generator.

Further, one or a plurality of a MEMS mirror, a bimetal, a photosensitive material, a heat-shrinkable material, a thermoplastic material, a MEMS heater, a speaker, a GLV device, a MEMS switch, a micro motor, a micro fluid device, and the like may be included as a microactuator.

Moreover, in this specification, a transducer may also correspond to an element which is manufactured through different manufacturing steps from those of an electronic circuit provided over the first substrate. An element which is manufactured through different manufacturing steps corresponds to, for example, an element which is manufactured by high temperature treatment where a semiconductor element included in the semiconductor integrated circuit cannot endure or chemical treatment, an element which is manufactured using a different substrate, or the like. For example, in the case of manufacturing a solar cell as a transducer, a soda glass substrate can be used as the second substrate. Therefore, in this specification, a transducer also corresponds to an element which is formed through different steps from those of the electronic circuit provided over the first substrate or an element which is manufactured using a different substrate from the first substrate.

Note that a semiconductor element corresponds to any element which has a semiconductor layer, such as a thin film transistor or a field effect transistor.

When the present invention is used, a semiconductor device in which communication is performed between a plurality of element groups can be provided without connecting the plurality of element groups provided over different substrates by a wiring or the like.

In addition, when connection portions by a wiring or the like between different element groups are eliminated or reduced, decrease in yield due to a defect generated at a connection portion by a wiring can be prevented, so that yield and reliability of the semiconductor device are improved.

Further, when the present invention is used, a semiconductor element included in an electronic circuit formed over one substrate and a semiconductor element included in another electronic circuit can have different structures depending on functions or the like.

Moreover, when a plurality of different substrates are used, manufacturing steps of an element group can be set as appropriate without depending on manufacturing steps of another element group, unlike the case where a MEMS structure and an electronic circuit are formed over the same substrate.

BRIEF DESCRIPTION OF THE DRAWINGS

In the accompanying drawings:

FIGS. 11A and 11B illustrate a semiconductor device of the present invention;

FIGS. 12A and 12B illustrate a semiconductor device of the present invention;

FIGS. 22(A-1) to 22(A-3) and 22B to 22C each illustrate a semiconductor device of the present invention.

DETAILED DESCRIPTION OF THE INVENTION

Figure 1A:
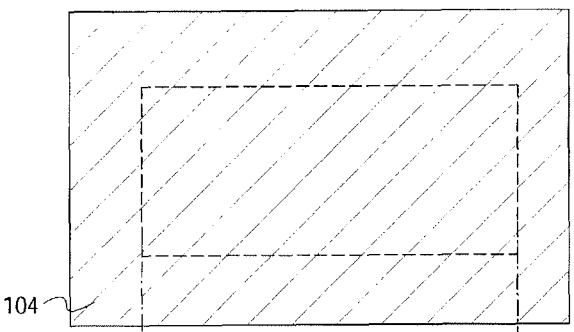
FIGS. 1A and 1B illustrate a semiconductor device of the present invention.

Hereinafter, embodiment modes and embodiments of the present invention will be described with reference to the drawings. Note that the present invention is not limited to the following description. The present invention can be implemented in various different ways and it will be readily appreciated by those skilled in the art that various changes and modifications are possible without departing from the spirit and the scope of the present invention. Therefore, the present invention should not be construed as being limited to the following description of the embodiment modes and embodiments. Note that as structures of the present invention are described with reference to the drawings, like portions are denoted by common reference numerals in different drawings.

Embodiment Mode 1

Figure 1B:
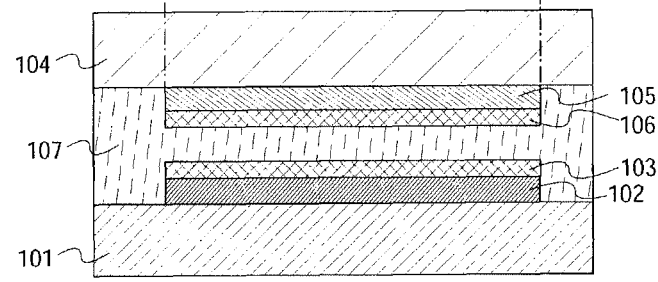

Examples of a semiconductor device of the present invention are described with reference to FIGS. 1A to 3E. FIGS. 1A and 1B are conceptual diagrams showing one mode of a semiconductor device of this embodiment mode. FIG. 1A is a top view and FIG. 1B is a cross-sectional view.

A first element group 102 and a first antenna 103 are provided over a first substrate 101. The first antenna 103 is connected to the first element group 102 physically and electrically. A second element group 105 and a second antenna 106 are provided on a second substrate 104. The second antenna 106 is connected to the second element group 105 physically and electrically.

Note that in this embodiment mode, an electronic circuit having a semiconductor element provided over a first substrate is referred to as a first element group, and an electronic circuit having a semiconductor element provided on a second substrate, a transducer, or the like is referred to as a second element group for convenience. A second element group may include both a transducer and an electronic circuit having a semiconductor element.

A bonding layer 107 is provided between the first substrate 101 and the second substrate 104, and the first substrate 101 and the second substrate 104 are bonded to each other with the bonding layer 107 interposed therebetween. The bonding layer 107 is provided on surfaces or rear surfaces of the first substrate 101 and the second substrate 104.

The first antenna 103 and the second antenna 106 can communicate with each other wirelessly, and the first element group 102 and the second element group 105 can communicate with each other wirelessly. In addition, each of the first element group 102 and the second element group 105 includes a function of transmitting and receiving which are necessary for wireless communication. Therefore, the first element group 102 and the second element group 105 can communicate with each other without being connected to each other physically using a wiring or the like.

Note that it is preferable to provide the first antenna 103 and the second antenna 106 so as to face each other.

Figure 2:
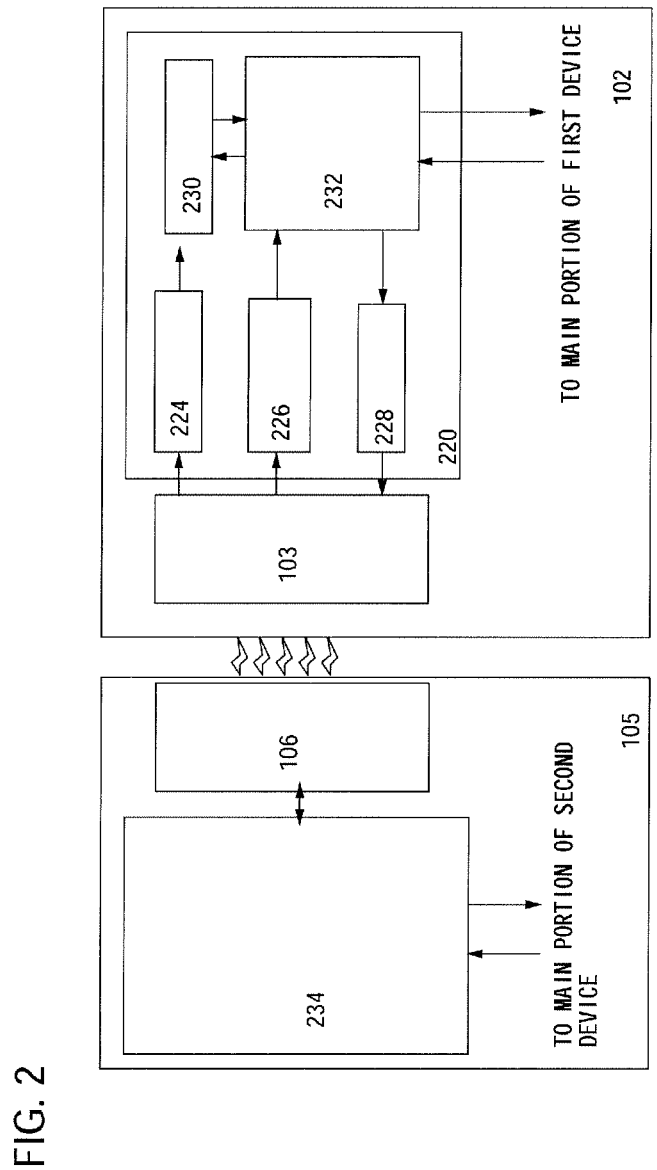
FIG. 2 illustrates a semiconductor device of the present invention.

FIG. 2 is a block diagram of wireless communication portions for realizing wireless communication functions, which are included in the first element group 102 and the second element group 105. Here, a first wireless communication portion 220 included in the first element group 102 is described; however, the same can be said for a second wireless communication portion 234 included in the second element group 105.

The second wireless communication portion 234 transmits signals to the first element group 102 through the second antenna 106. The transmitted signals are received by the first wireless communication portion 220 through the first antenna 103 which is connected to the first element group 102.

The first wireless communication portion 220 includes the first antenna 103, a power supply circuit 224, a demodulation circuit 226, a modulation circuit 228, a memory circuit 230, and a control circuit 232. Note that the first wireless communication portion 220 is not limited to the above-described structure, and the first wireless communication portion 220 may include a clock generation circuit, a central processing unit (hereinafter referred to as CPU), or the like. In addition, when it is not particularly necessary to provide the memory circuit 230, it does not need to provide the memory circuit 230. Further, when the first element group 102 only transmits signals and does not receive signals, it dose not need to provide a demodulation circuit in the first wireless communication portion 220. Similarly, when the first element group 102 only receives signals and does not transmit signals, it dose not need to provide a modulation circuit in the first wireless communication portion 220. The same can be said for the second wireless communication portion.

Note that here, a clock generation circuit corresponds to a circuit which generates clock signals having frequency necessary for operations of a control circuit, a memory circuit, and the like based on AC induced voltage generated in an antenna and supplies the clock signals to each circuit. For a clock generation circuit, an oscillation circuit may be used, or a frequency division circuit may be used.

The first antenna 103 preferably includes a rectifier circuit, and receives electromagnetic waves transmitted through the second antenna 106 from the second wireless communication portion 234 to generate AC induced voltage. This induced voltage is used as power supply voltage of the first wireless communication portion 220 and includes data transmitted from the second wireless communication portion 234.

Note that the shape of an antenna which can be used for the present invention is not particularly limited to a certain shape. As a transmission method of signals, an electromagnetic coupling method, an electromagnetic induction method, a radio frequency method, or the like can be used. It is acceptable as long as the transmission method is selected by a user as appropriate taking applications into consideration and an antenna having suitable length and shape is provided in accordance the transmission method. In the present invention, as the transmission method of signals, an electromagnetic induction method, which has communication frequency of 13.56 MHz, is preferably used.

In the case where an electromagnetic coupling method or an electromagnetic induction method (e.g., a 13.56 MHz band) is employed as the transmission method, a conductive film which functions as the antenna is formed to have a loop shape (e.g., a loop antenna) or a spiral shape (e.g., a spiral antenna) in order to utilize electromagnetic induction by change in electric field density.

For example, in the case where a microwave method which is a kind of a radio frequency method (e.g., a UHF band (an 860 to 960 MHz band) or a 2.45 GHz band), or a 300 MHz band or a 433 MHz band which is used for an active RFID tag or the like is employed as the transmission method, it is acceptable as long as the length and the shape of the conductive film which functions as the antenna are set as appropriate taking the wavelength of a radio wave which is used for transmission of signals into consideration. The conductive film which functions as the antenna can be formed to have a linear shape (e.g., a dipole antenna), a loop shape (e.g., a loop antenna), or a flat shape (e.g., a patch antenna, a slot antenna, or a slit antenna), for example. In addition, the shape of the conductive film which functions as the antenna is not limited to the linear shape, and the conductive film which functions as the antenna may have a curved shape, a meandering shape, or a shape in which these shapes are combined taking the wavelength of a radio wave into consideration.

Figure 3A:
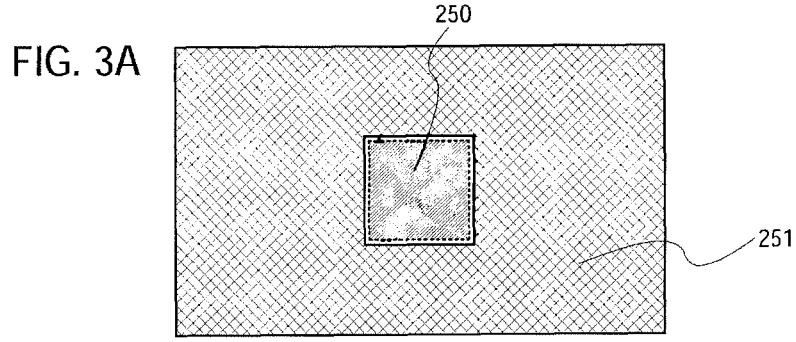
FIGS. 3A to 3E each illustrate an antenna included in a semiconductor device of the present invention.
Figure 3B:
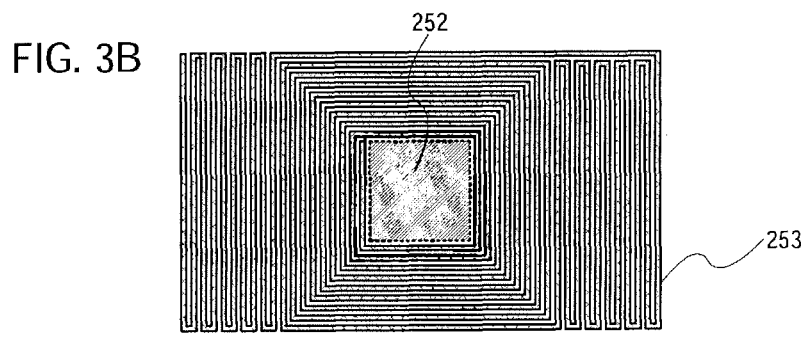
Figure 3C:
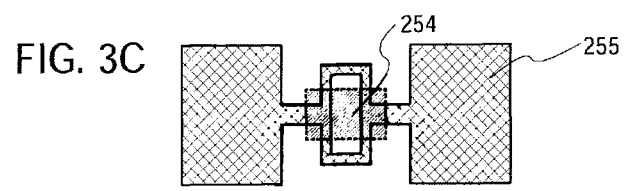
Figure 3D:
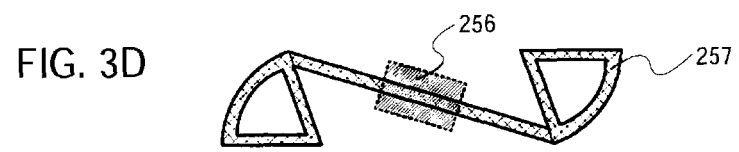
Figure 3E:
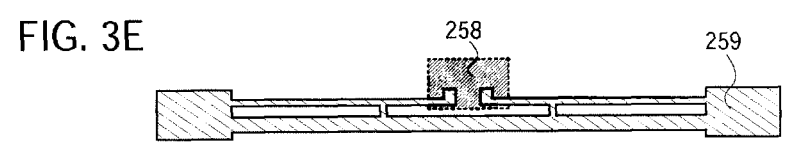

Here, FIGS. 3A to 3E show examples of the shapes of antennas which are provided as the first antenna 103 and the second antenna 106. For example, as shown in FIG. 3A, a structure may be used in which an antenna 251 is provided over one surface around a chip 250 provided with a signal processing circuit. As shown in FIG. 3B, a structure may be used in which a thin antenna 253 is provided so as to be rounded around a chip 252 provided with a signal processing circuit. As shown in FIG. 3C, a structure may be used in which an antenna 255 which can receive high-frequency electromagnetic waves is provided for a chip 254 provided with a signal processing circuit. As shown in FIG. 3D, a structure may be used in which an omnidirectional antenna (which can receive signals from any direction) 257 is provided for a chip 256 provided with a signal processing circuit. As shown in FIG. 3E, a structure may be used in which an antenna 259 which is extended to be a stick form is provided for a chip 258 provided with a signal processing circuit. As each of the first antenna 103 and the second antenna 106, these antennas may be combined to be used.

Alternatively, as the first antenna 103 and the second antenna 106, antennas shown in FIGS. 22A and 22C may be used. FIG. 22A is part of a hexagonal view of a patch antenna. A sheet 261C provided with an antenna is a dielectric. An antenna 261A is provided on a surface of the sheet 261C and a reflection film 261B is provided on a rear surface of the sheet 261C. Each of the antenna 261A and the reflection film 261B is formed using a conductive film. Note that FIG. 22(A-1) is a rear view, FIG. 22(A-2) is a bottom view, and FIG. 22(A-3) is a front view. A bottom view, a right side view, and a left side view are omitted. A chip 260 is insulated from the reflection film 261B and is electrically connected to the antenna 261A through holes provided in the reflection film 261B and the sheet 261C. A method for forming the through holes is not particularly limited to a certain method, and for example, a cutting work method using a machining center, a sand blasting method, photolithography, a laser drawing method, an ultrasonic processing method, or the like can be used.

FIG. 22B shows an example of a loop antenna. A chip 262 may be provided in the center of an antenna 263 having a shape in which two loops are linked.

FIG. 22C shows a slot antenna. An antenna 265A includes a slot 265B and a chip 264 may be provided so as to overlap with part of the slot 265B. In addition, the position of the slot 265B is not particularly limited to a certain position.

Note that the shapes of antennas which can be used in the present invention are not limited to the shapes shown in FIGS. 3A and 3E and FIGS. 22A to 22C. Any kind of antennas can be used as long as the present invention can be realized. Although not shown, an electric field resonant antenna or a magnetic field resonant antenna may be used, for example.

In addition, in each of FIGS. 3A and 3E and FIGS. 22A to 22C, a method for connecting the chip provided with the signal processing circuit and the antenna is not particularly limited to a certain method, and any kind of methods can be used as long as signals can be transmitted and received between a chip and an antenna. When FIG. 3A is used as an example, the antenna 251 and the chip 250 provided with the signal processing circuit may be connected using wire bonding or a bump, or part of the chip 250 may be used as an electrode to be attached to the antenna 251. In this method, the chip 250 can be attached to the antenna 251 by using an anisotropic conductive film (hereinafter referred to as an ACF). Further, the length of an antenna differs depending on frequency of received signals. For example, in the case where frequency is 2.45 GHz, the length of the antenna may be about 60 mm (½ wavelength) in the case of providing a half-wave dipole antenna, and the length of the antenna may be about 30 mm (¼ wavelength) in the case of providing a monopole antenna.

When induced voltage generated in the first antenna 103 is rectified by a diode or the like and is stabilized by using a capacitor, the power supply circuit 224 performs adjustment so that a stable potential having a constant potential difference between a reference potential (a potential of a reference line) can be generated.

The control circuit 232 performs operations such as analysis of instructions, control of the memory circuit 230, and outputting data to be transmitted outside to the modulation circuit 228, based on demodulated signals. It is preferable that the control circuit 232 include a decoding circuit, a data determination circuit, or the like when needed as well as a generation circuit of memory control signals. In addition, a circuit for converting part of or all data which is extracted from a main portion of the first element group or the memory circuit 230 and is transmitted from the first wireless communication portion 220 to the second wireless communication portion 234 into coded signals may be included. When the memory circuit 230 is not particularly necessary, it is not necessary to provide the memory circuit 230.

The modulation circuit 228 transmits load modulation to the first antenna 103 based on signals transmitted from the control circuit 232.

The demodulation circuit 226 demodulates data included in induced voltage which is generated in the first antenna 103.

Note that the electromagnetic waves transmitted from the second wireless communication portion 234 are obtained by modulating carrier waves of specified frequency using sub-carrier waves. Signals included in the sub-carrier waves are binary digital signals which are transmitted from the second wireless communication portion 234 to the first wireless communication portion 220. As a method for modulating the carrier waves, there are a PSK (phase shift keying) modulation method in which phases are shifted, an ASK (amplitude shift keying) modulation method in which amplitude is shifted, an FSK (frequency shift keying) modulation method in which frequency is shifted, and the like. In this embodiment mode, any of these methods can be used.

In addition, each of the first element group 102 and the second element group 105 may include a battery in which power is stored and a charging circuit which generates power from electromagnetic waves and transmits it to the battery. In this case, the charging circuit includes at least a rectifier circuit, a current-voltage control circuit, and a charging control circuit. When the power stored in the battery is utilized, the second element group 105 can be driven. Note that in the case of including the battery, the power supply circuit is not necessarily provided or both the power supply circuit and the battery may be used.

Here, a method for bonding the first substrate 101 and the second substrate 104 to each other is described. For example, in the case where the second element group 105 is a fixed element group such as an electron circuit having a semiconductor element or an optical transducer, the first substrate 101 and the second substrate 104 can be bonded to each other with the bonding layer 107 provided on the entire surface of the first substrate 101 and the second substrate 104 interposed therebetween (see FIGS. 1A and 1B). When the second substrate 104 is bonded to the first substrate 104 with the bonding layer 107 provided over the entire surface of the first substrate 101 interposed between the first substrate 101 and the second substrate 104 in this manner, a semiconductor device which is strong against physical external force can be manufactured and an element group which can endure dicing which is the severest process for manufacturing a semiconductor device can be manufactured.

Note that although the two substrates are bonded to each other with the first antenna 103 and the second antenna 106 facing each other in FIGS. 1A and 1B, the present invention is not limited to this. The two substrates may be bonded to each other without making the antennas face each other depending on applications.

When the present invention is used, in the case where a semiconductor device includes different element groups, signals can be transmitted and received between the element groups without physically connecting wirings or the like of the element groups. Therefore, it is not necessary to connect the different element groups by wirings or the like. Connection by wirings or the like is not necessary, so that a defect generated at a connection portion by a wiring can be prevented. Thus, yield and reliability of the semiconductor device are improved.

Further, when the present invention is used, a semiconductor element included in an electronic circuit formed over one substrate and a semiconductor element included in another electronic circuit can have different structures depending on functions or the like.

Moreover, when a plurality of different substrates are used, manufacturing steps of an element group can be set as appropriate without depending on manufacturing steps of another element group, unlike the case where a MEMS structure and an electronic circuit are formed over the same substrate.

Embodiment Mode 2

Figure 4A:
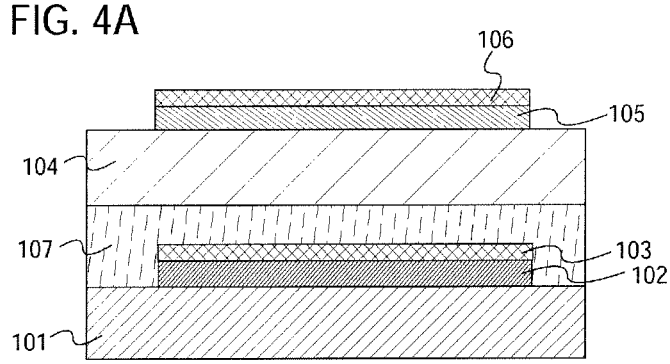
FIGS. 4A and 4B each illustrate a semiconductor device of the present invention.
Figure 4B:
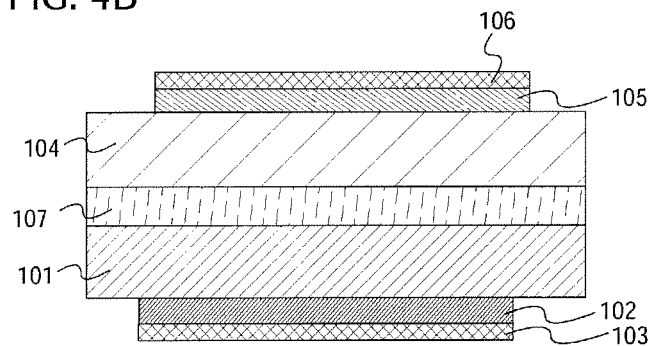

An example of an embodiment mode of the present invention is described with reference to FIGS. 4A and 4B. FIGS. 4A and 4B each show a conceptual cross-sectional view of one mode of a semiconductor device of this embodiment mode. Note that structures of elements groups, antennas, and the like are similar to those of Embodiment Mode 1.

In the semiconductor device shown in FIG. 4A, the surface of the first substrate 101 and the rear surface of the second substrate 104 are bonded to each other with the bonding layer 107 interposed therebetween. In the semiconductor device shown in FIG. 4B, the rear surface of the first substrate 101 and the rear surface of the second substrate 104 are bonded to each other with the bonding layer 107 interposed therebetween.

Note that a surface of a substrate corresponds to a surface on which an element group is provided, and a rear surface of a substrate corresponds to a surface on which an element group is not provided.

In the semiconductor device having the structure shown in FIG. 4A, the second element group 105 provided over the second substrate 104 is exposed to an external space. Therefore, in the case where the second element group 105 is an element group such as a sensor having a movable portion, the semiconductor device can be operated smoothly. Alternatively, in the case where the second element group 105 is a sensor or the like which detects a substance contained in the external space, when the structure shown in FIG. 4A is used, sensitivity as a sensor can be increased. In this case, the second antenna 106 may be provided between the second substrate 104 and the second element group 105.

Alternatively, the semiconductor device may have the structure shown in FIG. 4B. In the semiconductor device having the structure shown in FIG. 4B, not only the second element group 105 but also the first element group 102 is exposed to an external space. In the case where the first element group 102 or the second element group 105 has a movable portion, the semiconductor device can be operated smoothly. Alternatively, in the case where the first element group 102 or the second element group 105 is a sensor or the like which detects a substance contained in the external space, the structure shown in FIG. 4B is preferably used.

In addition to the advantageous effect of the semiconductor device of Embodiment Mode 1, in the semiconductor device of this embodiment mode, operations can be performed smoothly when the element group provided over the substrate has a movable portion. Further, even in the case where the element group is a sensor or the like which detects a substance contained in the external space, operations can be performed without impeding functions of the element group.

Embodiment Mode 3

Figure 5A:
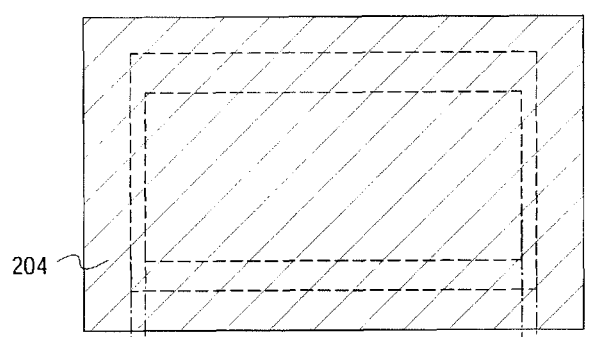
FIGS. 5A and 5B illustrate a semiconductor device of the present invention.
Figure 5B:
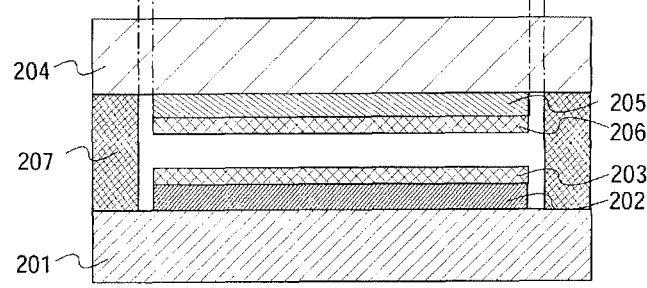

An example of an embodiment mode of the present invention is described with reference to FIGS. 5A and 7B. FIGS. 5A and 5B show one mode of a semiconductor device of this embodiment mode. Note that structures of elements groups, antennas, and the like are similar to those of Embodiment Mode 1.

FIGS. 5A and 5B show the semiconductor device of this embodiment mode. FIG. 5A is a top view and FIG. 5B is a cross-sectional view. In the semiconductor device shown in FIGS. 5A and 5B, a surface of a first substrate 201 and a surface of a second substrate 204 are bonded to each other with a bonding layer 207 interposed therebetween. Unlike the semiconductor device shown in FIGS. 1A and 1B, the bonding layer 207 is not provided over the entire surface of the substrate but is provided on only part of the substrate. Specifically, the bonding layer 207 is provided in a region which does not overlap with a first element group 202 provided over the first substrate 201 and a second element group 205 provided over the second substrate 204.

As shown in FIGS. 5A and 5B, when the surface of the first substrate 201 and the surface of the second substrate 204 are bonded to each other, the first element group 202 and the second element group 205 are provided so as not to overlap with the bonding layer 207, and the thickness of the bonding layer 207 is made thicker than that of the thickest part of each of the first element group 202 and the second element group 205. Thus, spaces can be secured on the first element group 202 and the second element group 205.

Note that a surface of a substrate corresponds to a surface on which an element group is provided, and a rear surface of a substrate corresponds to a surface on which an element group is not provided.

Figure 6:
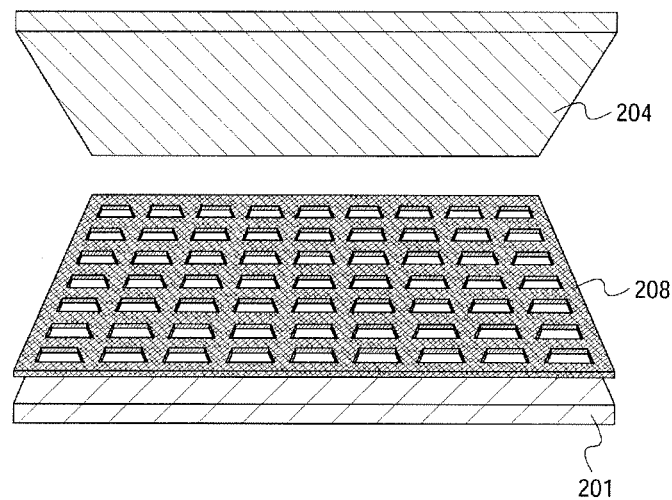
FIG. 6 illustrates a semiconductor device of the present invention.

Alternatively, as shown in FIG. 6, a mesh third substrate (an intermediate substrate 208) having holes is provided between the first substrate 201 and the second substrate 204 to bond the first substrate 201 and the second substrate 204 to each other. When the intermediate substrate 208 is provided between the first substrate 201 and the second substrate 204, a space between the first substrate 201 and the second substrate 204 can be secured. In addition, when the first substrate 201 and the second substrate 204 are bonded to each other without providing bonding layers between the first substrate 201 and the intermediate substrate 208 and between the second substrate 204 and the intermediate substrate 208, the height of the space between the first substrate 201 and the second substrate 204 can be made uniform, which is preferable. Examples of a method for bonding the substrates without providing a bonding layer in this manner are anodic bonding and surface activated bonding.

Here, anodic bonding corresponds to a method in which smooth surfaces of a single crystal silicon substrate and a glass substrate containing alkali metal ions are touched with each other, DC voltage is applied between the glass substrate and the single crystal silicon substrate at a temperature where thermal diffusion of alkali metal ions are generated, electrostatic attraction is generated between the glass substrate and the single crystal silicon substrate, and a chemical bond is generated at an interface between the single crystal substrate and the glass substrate to be bonded to each other, for example.

Specifically, the glass substrate and the single crystal silicon substrate are heated at a heating stage to make movable ions in the glass substrate move easily, DC voltage is applied so that a potential of the single crystal silicon substrate is a positive potential and a potential of the glass substrate is a negative potential or a ground potential to generate a chemical bond, and the single crystal silicon substrate and the glass substrate adhere to each other. At this time, it is necessary that the single crystal silicon substrate and the glass substrate have almost the same coefficients of thermal expansion. In addition, it is preferable that arithmetic mean deviation of a bond surface is controlled to be 0.2 μm or less.

In addition, when voltage is applied so that the potential of the glass substrate is a negative potential or a ground potential, alkali metal ions which move in the glass substrate concentrate on a surface of the glass substrate, so that the glass substrate is transformed or become opaque. Therefore, in anodic bonding, a glass substrate serving as a dummy substrate is preferably provided between an intermediate substrate and an electrode. Note that the present invention is not limited to this, and anodic bonding may be performed with a glass substrate and an intermediate substrate in contact with each other.

Further, as shown in FIG. 6, in the case where the first substrate 201 and the second substrate 204 are glass substrates and the intermediate substrate 208 is provided therebetween as a metal layer for bonding, smooth surfaces of the first substrate 201 which is formed using glass containing alkali metal ions and the intermediate substrate 208 which is the metal layer for bonding, or smooth surfaces of the second substrate 204 and the intermediate substrate 208 which is the metal layer for bonding are touched with each other. Then, DC voltage is applied between the first substrate 201 and the second substrate 204, and the intermediate substrate 208 at a temperature where thermal diffusion of alkali metal ions are generated. Then, electrostatic attraction is generated between the first substrate 201 and the second substrate 204, and the intermediate substrate 208, and a chemical bond is generated at an interface between the first substrate 201 and the second substrate 204, and an interface between the second substrate 204 and the intermediate substrate 208 to be bonded to each other.

Specifically, DC voltage is applied so that a potential of the intermediate substrate 208 is a positive potential and potentials of the first substrate 201 and the second substrate 204 are negative potentials or ground potentials to generate a chemical bond at an interface, and the intermediate substrate 208, and the first substrate 201 and the second substrate 204 adhere to each other. At this time, it is necessary that the first substrate 201 and the second substrate 204 have almost the same coefficients of thermal expansion. In addition, as described above, in anodic bonding, a dummy substrate is preferably provided between an electrode and a glass substrate. Further, it is preferable that arithmetic mean deviation of a bond surface of the first substrate 201 and the intermediate substrate 208 and a bond surface of the intermediate substrate 208 and the second substrate 204 is controlled to be 0.2 μm or less.

As described above, since substrates are bonded to each other tightly when anodic bonding is used, an effect of blocking the outside and the inside of a semiconductor device can be dramatically improved.

Surface activated bonding may be used in the present invention as well as anodic bonding. Surface activated bonding is described below.

When substrates are bonded to each other, cleaning or the like is generally performed on a first substrate and a second substrate which are to be bonded to each other before bonding. However, in the atmosphere, surfaces of the substrates are covered with an oxide film formed using oxygen, absorbed water, or an organic molecule (contaminant). For example, a single crystal silicon substrate is covered with an oxide film of silicon, a hydroxyl group on a surface, an absorbed water molecule, or the like even right after cleaning treatment. In surface activated bonding, a contaminated layer on a surface, which is impediment of bonding, is removed and connectors of atoms of surfaces of the substrate which are to be bonded are directly bonded to each other, so that the substrates can be bonded to each other tightly.

First, in order to remove a surface layer, sputter etching using an ion beam, plasma, or the like of an inert gas such as argon is used. When sputter etching is performed, the surfaces of the substrates also easily react with ambient gas molecules. Thus, this step is performed in a high-vacuum chamber. Since the surfaces of the substrates after sputter etching are chemically activated, the substrates can be bonded to each other further tightly at a lower temperature than the case of using anodic bonding by touching with each other. With surface activated bonding, bonding at room temperature can be performed.

Here, as an ion beam, a fast atomic beam of argon which is electrically neutral can be used. Beam irradiation treatment and activation treatment are performed on the surfaces of the substrates in a chamber for bonding to bond the substrates to each other. In the case of a single crystal silicon substrate or a metal substrate, it is difficult to perform bonding in the atmosphere. Alternatively, in the case of bonding glass substrates to each other, contaminated surfaces are removed by plasma etching and surface activation is performed by high-frequency plasma radical treatment, so that bonding in the atmosphere can be performed. Further alternatively, when heating or pressurization is used, bonding can be performed even in the case where roughness of the surfaces is large. Here, roughness corresponds to arithmetic mean deviation.

When above-described surface activated bonding is used, various substrates can be bonded to each other at a low temperature (preferably room temperature). It is necessary that substrates to be bonded to each other have almost the same coefficients of thermal expansion in anodic bonding; however, substrates having different coefficients of thermal expansion can be bonded to each other in surface activated bonding. Therefore, when surface activated bonding is used, substrates having different coefficients of thermal expansion can be bonded to each other.

Figure 7A:
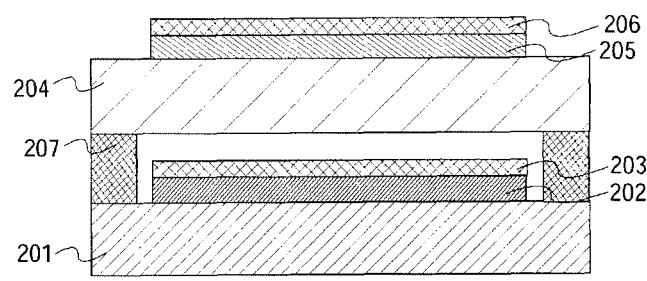
FIGS. 7A and 7B each illustrate a semiconductor device of the present invention.
Figure 7B:
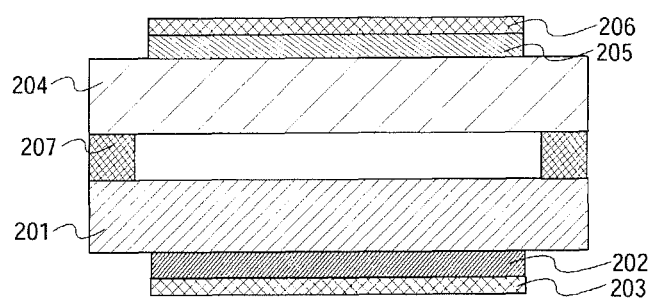

Note that the semiconductor device described in this embodiment mode is not limited to the structure shown in FIGS. 5A and 5B, and only the second element group 205 may be provided outside a sealed space, as shown in FIG. 7A. Alternatively, both the first element group 202 and the second element group 205 are provided outside sealed spaces, as shown in FIG. 7B. When elements groups are provided as shown in FIGS. 7A and 7B, an element group having a movable portion can be operated smoothly. In addition, when an element group is a sensor or the like which detects a substance contained in the external space, operations can be performed without impeding functions of the element group. Further, surface activated bonding can be performed also in the structure shown in FIGS. 7A and 7B, and bonding at a lower temperature can be performed.

When anodic bonding or surface activated bonding is used as described above, a semiconductor device in which tight sealing is necessary, such as a MEMS element group, can also be manufactured.

In the semiconductor device of this embodiment mode, the inside and the outside of the semiconductor device can be completely sealed tightly. Therefore, in addition to the advantageous effects of the semiconductor devices of Embodiment Modes 1 and 2, an element group or the like which deteriorates by being exposed to the atmosphere or the water can be used.

Further, when the first substrate and the second substrate are bonded to each other not using a bonding layer but using an intermediate substrate between the first substrate and the second substrate, the distance between the first substrate and the second substrate can be controlled precisely.

Embodiment Mode 4

Figure 8A:
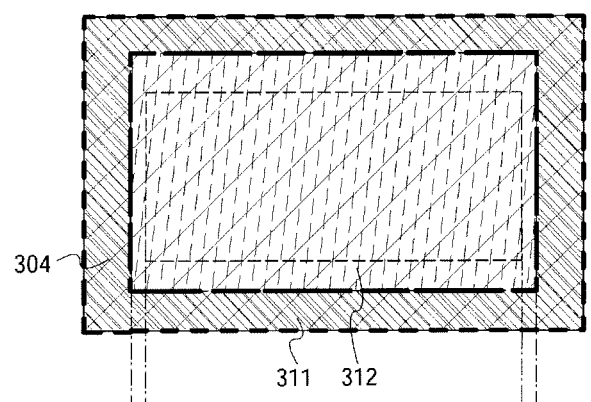
FIGS. 8A and 8B illustrate a semiconductor device of the present invention.
Figure 8B:
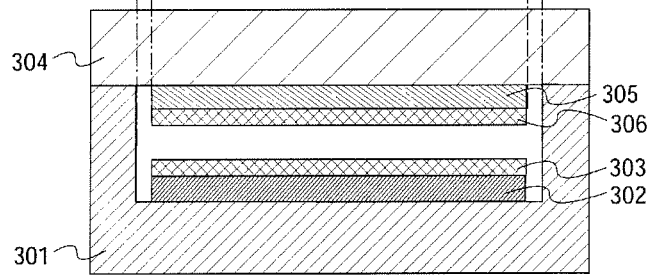
Figure 9A:
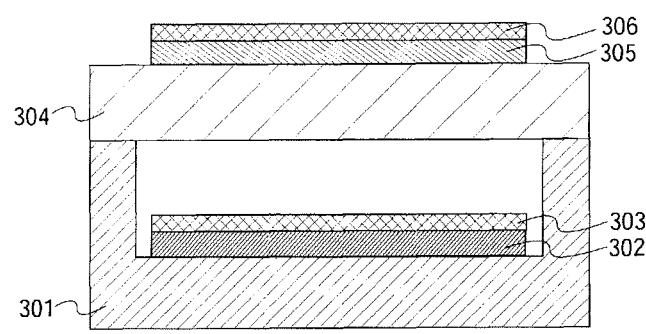
FIGS. 9A and 9B each illustrate a semiconductor device of the present invention.
Figure 9B:
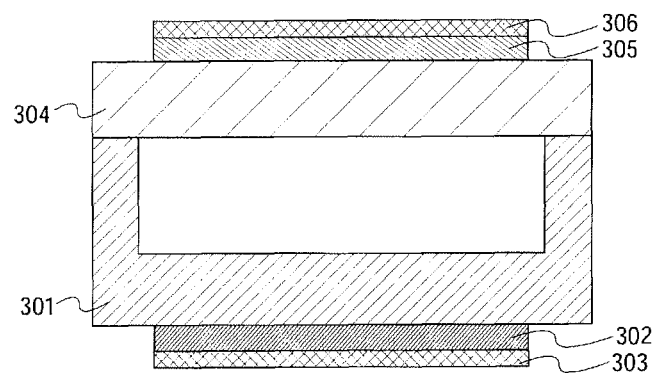

An example of an embodiment mode of the present invention is described with reference to FIGS. 8A and 8B and FIGS. 9A and 9B. In a semiconductor device of the present invention, a depressed portion having a planar bottom surface is provided in one of substrates and an element group is provided in the depressed portion. FIGS. 8A and 8B show one mode of a semiconductor device of this embodiment mode. Note that structures of elements groups, antennas, and the like are similar to those of Embodiment Mode 1.

FIGS. 8A and 8B show the semiconductor device of this embodiment mode. FIG. 8A is a top view and FIG. 8B is a cross-sectional view. In the semiconductor device shown in FIGS. 8A and 8B, a first substrate 301 and a second substrate 304 are bonded to each other without interposing a bonding layer or an intermediate substrate therebetween. The first substrate 301 and the second substrate 304 may be bonded to each other using anodic bonding or surface activated bonding described in Embodiment Mode 3. The first substrate 301 includes a first region 311 bonded to the second substrate 304 and a second region 312 which is a depressed portion having a planar bottom surface. A first element group 302 and a second element group 305 are provided in the second region 312 included in the first substrate 301. The first substrate 301 and the second substrate 304 are bonded to each other.

Note that a surface of a substrate corresponds to a surface on which an element group is provided, and a rear surface of a substrate corresponds to a surface on which an element group is not provided.

In addition, the semiconductor device of this embodiment mode is not limited to the structure shown in FIGS. 8A and 8B. In the semiconductor device shown in FIGS. 8A and 8B, a surface (a front surface) of the first substrate over which the first element group is provided and a surface (a front surface) of the second substrate on which the second element group is provided face each other to be bonded; however, in a semiconductor device shown in FIG. 9A, a surface (a front surface) of the first substrate over which the first element group is provided and a surface (a rear surface) which is opposite to a surface of the second substrate over which the second element group is provided face each other to be bonded. In a semiconductor device shown in FIG. 9B, a surface (a rear surface) which is opposite to a surface of the first substrate over which the first element group is provided and a surface (a rear surface) which is opposite to a surface of the second substrate over which the second element group is provided face each other to be bonded.

Note that although a structure where the depressed portion having a planar bottom surface is provided over the first substrate is used, the depressed portion may be provided in the second substrate. In order to provide the depressed portion in the first substrate or the second substrate, it is acceptable as long as a cutting work method using a machining center, a sand blasting method, photolithography, or a laser drawing method is used. The depth of the depressed portion may be determined by the thickness of an element group provided in the depressed portion.

In addition to advantageous effects of semiconductor devices of other embodiment modes, the semiconductor device of this embodiment mode has an advantageous effect in that the inside and the outside of the semiconductor can be sealed further tightly than that of Embodiment Mode 3. Therefore, when the semiconductor device is exposed to the atmosphere or the water, an element group which heavily deteriorates can be mounted.

Embodiment Mode 5

Figures 10A, 10B:
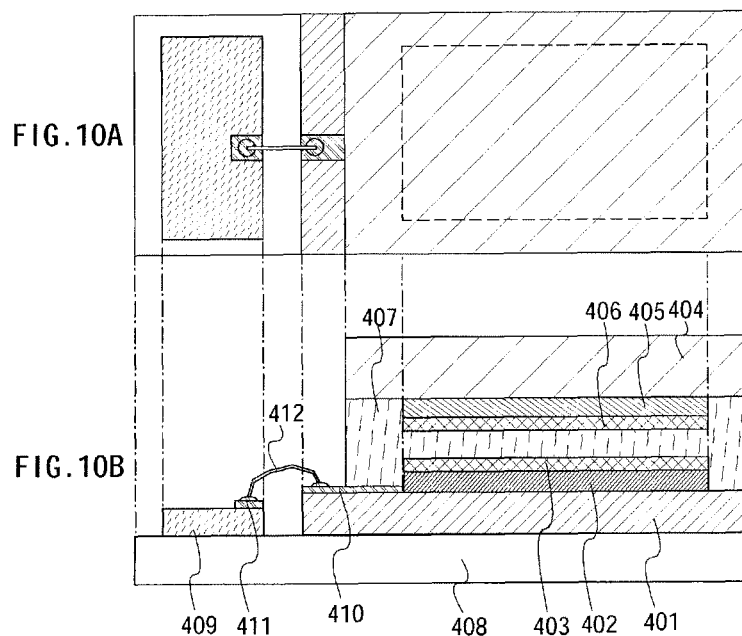
FIGS. 10A and 10B illustrate a semiconductor device of the present invention.

An example of an embodiment mode of the present invention is described with reference to FIGS. 10A and 10B. FIGS. 10A and 10B show a semiconductor device of this embodiment mode. FIG. 10A is a top view and FIG. 10B is a cross-sectional view. Note that structures and the like of elements groups and antennas are similar to those of Embodiment Mode 1.

In the semiconductor device shown in FIGS. 10A and 10B, a first element group 402 having a first antenna 403 is provided over a first substrate 401, a second element group 405 having a second antenna 406 is provided on a second substrate 404, and a surface of the first substrate 401 and a surface of the second substrate 404 are bonded to each other with a bonding layer 407 provided over the entire surface of the first substrate 401 interposed therebetween. A third element group 409 is provided over a third substrate 408, and the first substrate 401 bonded to the second substrate 404 is bonded to the third substrate 408. An external electrode 410 connected to the first element group 402 and an external electrode 411 connected to the third element group 409 are connected through a wiring 412. The external electrode 410 and the external electrode 411 are connected by wire bonding or the like.

In addition, a method for connecting the third element group provided over the third substrate and the first element group provided over the first substrate in this embodiment mode is not limited to the above-described method, and they may be connected as shown in FIGS. 11A and 11B.

In a semiconductor device shown in FIGS. 11A and 11B, a first element group 502 having a first antenna 503 is provided over a first substrate 501, a second element group 505 having a second antenna 506 is provided on a second substrate 504, and a surface of the first substrate 501 and a surface of the second substrate 504 are bonded to each other with a bonding layer 507 provided over the entire surface of the first substrate 501 interposed therebetween. FIG. 11A is a top view and FIG. 11B is a cross-sectional view. A third element group 509 is provided over a third substrate 508, and the first substrate 501 bonded to the second substrate 504 is bonded to the third substrate 508. Through holes are provided in the first substrate 501, and the first element group 502 and the third element group 509 are connected through electrodes 510 provided in the through holes. Through holes may be provided in the second substrate, and in order to provide through holes in the first substrate or the second substrate, it is acceptable as long as any of a cutting work method using a machining center, a sand blasting method, photolithography, a laser drawing method, and an ultrasonic processing method is used. In addition, an external electrode connected to the third element group 509 may be provided over the third substrate 508, and the external electrode and the electrode 510 may be connected.

Note that when one of the first element group 502 and the second element group 505 is provided so as to be exposed to an external space, a structure may be used in which the electrode 510 is directly connected thereto without providing through holes.

Alternatively, as shown in FIGS. 12A and 12B, a structure may be used in which the third element group communicates with the first element group or the second element group wirelessly. In a semiconductor device shown in FIGS. 12A and 12B, a first element group 602 having a first antenna 603 is provided over a first substrate 601, a second element group 605 having a second antenna 606 is provided on a second substrate 604, and a surface of the first substrate 601 and a surface of the second substrate 604 are bonded to each other with a bonding layer 607 provided over the entire surface of the first substrate 601 interposed therebetween. A third element group 609 having a third antenna 610 is provided over a third substrate 608, and the first substrate 601 bonded to the second substrate 604 is bonded to the third substrate 608. With the structure shown in FIGS. 12A and 12B, a defect generated at a connection portion by a wiring is not generated unlike in FIGS. 10A and 10B and FIGS. 11A and 11B, so that yield and reliability of the semiconductor device can be dramatically improved.

Note that in the case of the structure shown in FIGS. 12A and 12B, it should be careful not to cause interference of wireless communication between the first element group and the second element group and wireless communication between the third element group and the first element group or the second element group. In order to prevent interference, a method for wireless communication may be changed, for example. Specifically, the first antenna connected to the first element group and the second antenna connected to the second element group may be provided to face each other so as to be magnetically coupled to perform wireless communication, and the first element group and the third element group may perform wireless communication through electromagnetic waves.

Note that although the first substrate and the second substrate are connected with the bonding layer provided over the entire surface of each substrate interposed therebetween in this embodiment mode, the present invention is not limited to this. The first substrate and the second substrate may be connected with a bonding layer provided over part of the surface of each substrate interposed therebetween, or may be connected through an intermediate substrate. Alternatively, a structure may be used in which a depressed portion having a planar bottom surface is provided in one of the substrates and the element group is provided in the depressed portion having a planar bottom surface. In addition, although the surfaces of the first substrate and the second substrate are bonded to each other in FIGS. 10A to 12B, the surface of the first substrate and the rear surface of the second substrate may be bonded to each other, the rear surface of the first substrate and the surface of the second substrate may be bonded to each other, or the rear surface of the first substrate and the rear surface of the second substrate may be bonded to each other. Bonding may be performed with a bonding layer interposed therebetween, or may be performed by anodic bonding, surface activated bonding, or the like.

The third substrate and the first substrate may be bonded to each other with a bonding layer interposed therebetween, or may be bonded to each other by anodic bonding, surface activated bonding, or the like. Alternatively, the third substrate and the second substrate may be bonded to each other.

Note that the third substrate and the first substrate or the second substrate may be bonded to each other using an adhesive agent, a solder, or the like.

As described above, when the present invention is used, three or more elements can be mounted on one semiconductor device.

Note that since this embodiment mode can be partially replaced with the structures of Embodiment Modes 1 to 4, the semiconductor device or the like of this embodiment mode also has advantageous effects and the like of the semiconductor devices of Embodiment Modes 1 to 4.

Embodiment Mode 6

In this embodiment mode, a specific example of a transducer which is used as each of the first to third element groups provided on the first to third substrates in Embodiment Modes 1 to 5 is described with reference to FIGS. 13A and 13B.

Figure 13A:
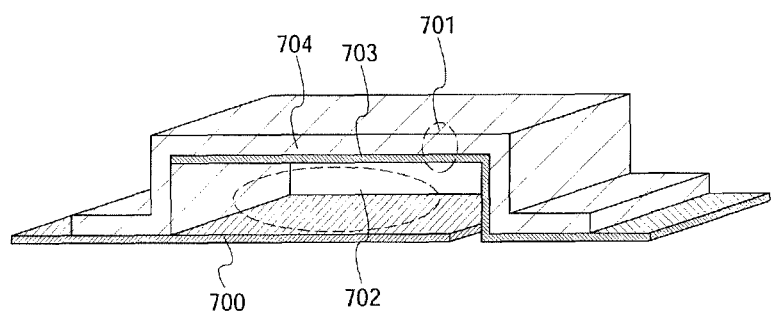
FIGS. 13A and 13B each illustrate an example of an element group included in a semiconductor device of the present invention.
Figure 13B:
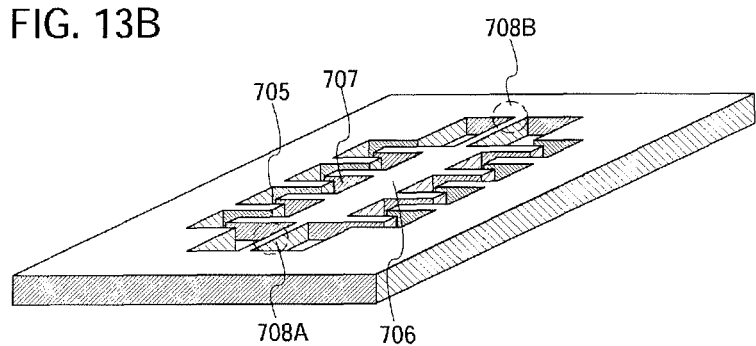

FIGS. 13A and 13B each show a MEMS structure manufactured using micromachining technology as an example of a transducer.

In the MEMS structure shown in FIG. 13A, a first conductive layer 700 and a structural layer 701 are formed over a substrate (not shown), and a space portion 702 is provided between the first conductive layer 700 and the structural layer 701. A sacrificial layer and the structural layer 701 are provided over the first conductive layer 700, and then only the sacrificial layer is removed by etching, so that the space portion 702 can be formed.

The MEMS structure formed as described above includes the first conductive layer 700 provided over the substrate, the space portion 702, and a second conductive layer 703 which faces the first conductive layer 700. One of the first conductive layer 700 and the second conductive layer 703 is an electrode which is fixed to the substrate and does not move (referred to as a fixed electrode), and the other thereof is an electrode which can move in the space portion 702 (referred to as a movable electrode).

Here, the names "fixed electrode" and "movable electrode" are given for convenience in order to express whether an electrode is fixed to a substrate or the like or an electrode can move mechanically. Therefore, it is noted that the names "fixed electrode" and "movable electrode" are not derived from a potential of an electrode.

In addition, as shown in FIG. 13B, the MEMS structure may have a comb shape and can move in a direction parallel to a substrate surface. In this case, the MEMS structure includes a fixed electrode (a first conductive layer 705) which is provided on a side surface of the comb shape fixed to the substrate, i.e., a surface perpendicular to the substrate, and a structural layer 706 which is formed so as to engage with a cog of the fixed electrode with a space interposed therebetween. In addition, the structural layer 706 includes a movable electrode (a second conductive layer 707) on a surface opposite to the first conductive layer 705.

Part of the MEMS structure shown in FIG. 13B is connected to a layer formed over a substrate, so that the MEMS structure is fixed to the substrate and can move in a predetermined direction (e.g., a comb-shaped direction). For example, in the case of the MEMS structure shown in FIG. 13B, the MEMS structure has spaces between the first conductive layer 705 and the second conductive layer 707 and between the substrate and the structural layer to be separated from the substrate, and the structural layer is fixed to part of the substrate at two portions in a direction where a cog is not provided (portions 708A and 708b shown in FIG. 13B), so that the MEMS structure can move in a comb-shaped direction (a horizontal direction in the diagram).

As described with reference to FIGS. 13A and 13B, a MEMS structure having various shapes can be formed using micromachining technology. In the MEMS structure shown in FIG. 13A, the fixed electrode (the first conductive layer 705) and the movable electrode (the second conductive layer 707) are formed on the surface parallel to the substrate, and the space is provided between the fixed electrode and the movable electrode. On the other hand, in the MEMS structure shown in FIG. 13B, the fixed electrode and the movable electrode are provided in a direction perpendicular to the substrate, and the spaces are provided between the fixed electrode and the movable electrode and between the substrate and the structural layer. When a MEMS structure having a different shape is provided in this manner, a movable direction of a structural layer can be changed, so that the MEMS structure can be used for a different purpose (e.g., a transducer having a different direction or different physical quantity).

A MEMS structure formed as described above can function as an actuator, a movable electrode (or a structural layer) of which is operated when voltage is applied between the fixed electrode and the movable electrode and the movable electrode is attracted on the fixed electrode side by electrostatic attraction. In addition, since electrostatic capacitance between the two electrodes is changed when the structural layer 701 receives external force (pressure or acceleration) and operates in the space portion 702, the above-described MEMS structure can function as a transducer which detects change in the capacitance.

Note that the MEMS structure described here is just an example, and a shape which is in accordance with application or the like is formed in a step which is appropriate for the shape by various driving methods, so that a MEMS structure having a predetermined function can be manufactured. For example, the MEMS structure shown in FIG. 13A can be used as a transducer which detects whether the structural layer fluctuates by receiving force from a top surface of the substrate and can be used as a variable capacitor which changes capacitance between the two substrates. When the same MEMS structure has different operations, a MEMS structure having different functions can be provided.

It is difficult to manufacture such a MEMS structure and a field effect transistor which is generally manufactured over a silicon wafer at the same time. Therefore, it is preferable to manufacture such a MEMS structure over a different substrate from that of a field effect transistor. In addition, it is preferable to separately manufacture a second antenna to be connected.

Here, if strength of electromagnetic waves emitted from a first antenna is constant, when the movable electrode of the MEMS structure moves, impedance of the MEMS structure in FIG. 13A is changed. In the case where the second conductive layer of the MEMS structure is connected to the second antenna, the amount of current flowing through the second antenna is changed. Therefore, the second antenna outputs an electromagnetic wave having strength which is proportional to a current value.

When strength of electromagnetic waves emitted from the first antenna is constant and change in power of electromagnetic waves emitted from the second antenna is detected, operations of the MEMS structure can be received by a first element group.

In addition, the case is described in which an optical transducer (also referred to as a photo IC, a photodiode, and a photoelectric conversion element) is used as a transducer.

A large number of photoelectric conversion elements generally used for detecting light or an electromagnetic wave are known, and photoelectric conversion elements having sensitivity to a visible light region are particularly referred to as visible light transducers. A large number of visible light transducers are used for devices which need illuminance adjustment, on/off control, or the like depending on human living environment. In such a photoelectric conversion element, electrons and holes are generated by being irradiated with light to generate current. Then, when the current is input to a semiconductor element, the fact that light is detected is transmitted.

An optical transducer of this embodiment mode includes at least a photoelectric conversion element and a current amplifier circuit. In the optical transducer of this embodiment mode, a photoelectric conversion element and a semiconductor element forming a current amplifier circuit are formed over a substrate, and a wiring for connecting the semiconductor element and the photoelectric conversion element are provided thereover. In the case where a metal wiring is provided over a photoelectric conversion element in this manner, a structure in which an optical transducer is formed over a glass substrate and light is detected in a glass-surface direction is generally used.

In this manner, the optical transducer may be formed over a glass substrate. Thus, the photoelectric conversion device (a photoelectric conversion element and a current amplifier circuit) shown in FIG. 8B, a power supply circuit, a modulation circuit, and the second antenna are manufactured on the second substrate. Then, by bonding to the first substrate, a semiconductor device of the present invention can be manufactured. Here, a silicon wafer is used as the first substrate and the first element group is manufactured using a field effect transistor or the like, so that sensitivity of the photoelectric conversion element can be increased.

In the present invention, when a detection element of a transducer and a circuit for processing detected signals are separately provided as described above, bonding is performed with a structure where wireless communication is performed therebetween. Thus, a wiring step of connecting the detection element and the circuit for processing detected signals is not necessary.

This embodiment mode can be freely combined with any of other embodiment modes.

Embodiment 1

Each of the element groups of the present invention described in Embodiment Modes 1 to 6 includes a transistor. As a transistor, a thin film transistor can be used, for example. In this embodiment, an example of a method for manufacturing a thin film transistor obtained by forming silicon over a glass substrate is described with reference to FIGS. 14A to 14C. In addition, depending on applications of the semiconductor device, a semiconductor element formed over the glass substrate can be separated to attach it to a flexible substrate. These manufacturing steps are described with reference to FIGS. 15A to 15C.

First, a separation layer 802 is formed over a glass substrate 801. A quartz substrate, a silicon substrate, a metal substrate, or the like can be used as the substrate as well as a glass substrate; however, here, a glass substrate is used. As the separation layer 802, an element or a compound of metal, silicon, or the like is formed over the entire surface or part of the substrate. Note that in the case where steps of separating a semiconductor element from the glass substrate 801 and attaching it to a flexible substrate is not performed, the separation layer 802 is not necessarily formed.

Next, an insulating layer 803 is formed so as to cover the separation layer 802. As the insulating layer 803, silicon oxide, silicon nitride, or the like may be formed by CVD, sputtering, or the like. Next, a semiconductor film serving as a semiconductor layer 804 is formed over the insulating layer 803, and hydrogen which remains in the semiconductor film is removed by heat treatment of approximately 500° C. Note that the semiconductor film may be formed by CVD using a silane gas. Then, the semiconductor film is crystallized. The semiconductor film is crystallized by a laser crystallization method, a thermal crystallization method using a metal catalyst, or the like, for example. Then, the crystallized semiconductor film is patterned into a desired shape to form the semiconductor layer 804. Next, a gate insulating layer 805 is formed so as to cover the semiconductor film. It is acceptable as long as the gate insulating layer 805 is formed using silicon oxide, silicon nitride, or the like, similarly to the insulating layer 803.

Figure 14A:
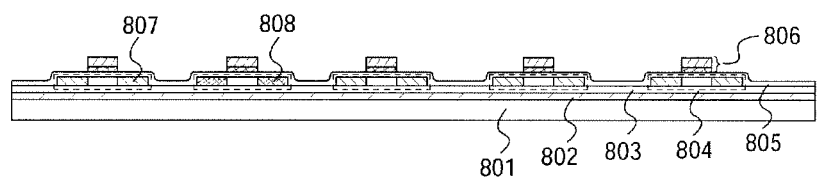
FIGS. 14A to 14C illustrate a method for manufacturing a semiconductor device of the present invention.

Next, a gate electrode layer 806 is formed. As the gate electrode layer 806, a conductive layer is formed using an element or a compound which has conductivity and is patterned into a desired shape. FIG. 14A shows the case where the gate electrode layer is formed to have a stacked-layer structure.

Next, impurity elements are added to the semiconductor layer 804 to form an N-type impurity region 807 and a P-type impurity region 808. A resist mask is formed using photolithography and an impurity element such as phosphorus (P), arsenic (As), or boron (B) is added to form each of the impurity regions (see FIG. 14A).

Figure 14B:
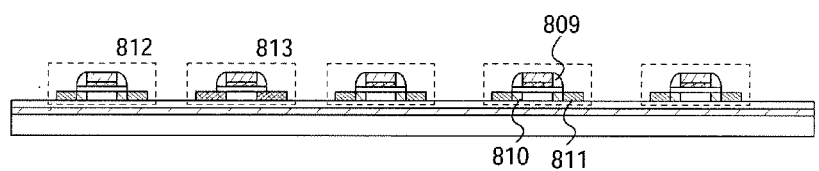

Next, an insulating film is formed using silicon nitride or the like and is anisotropically etched perpendicularly to the substrate to form insulating layers 809 as sidewalls which are in contact with side surfaces of the gate electrode layer 806 (see FIG. 14B).

Next, an impurity is further added to the semiconductor layer 804 having the N-type impurity region to form a first N-type impurity region 810 located below the insulating layers 809 and a second N-type impurity region 811 having higher impurity concentration than the first N-type impurity region 810. In this manner, an N-channel transistor 812 and a P-channel transistor 813 are formed.

Figure 14C:
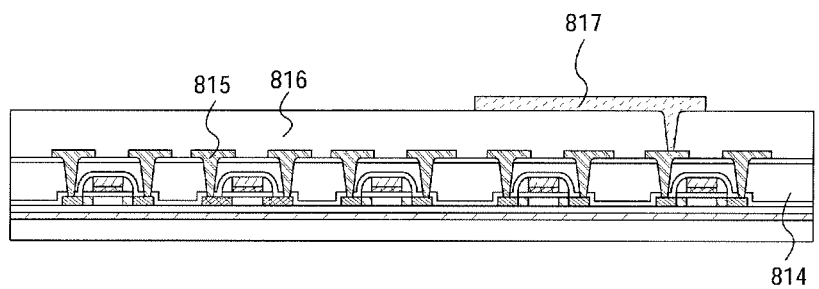

Subsequently, an insulating layer 814 is formed to cover the N-channel transistor 812 and the P-channel transistor 813. The insulating layer 814 is formed using an inorganic compound, an organic compound, or the like which has insulating properties. FIG. 14C shows an example in which the insulating layer 814 is formed to have a stacked-layer structure. After that, contact holes which expose the second N-type impurity region 811 and the P-type impurity region 808 are formed. Then, conductive layers 815 are formed so as to be connected through the contact holes and have a desired pattern. It is acceptable as long as the conductive layers 815 are formed using a metal element, a compound, or the like which has conductivity.

Next, an insulating layer 816 is formed so as to cover the conductive layers 815. It is acceptable as long as the insulating layer 816 is formed using an inorganic compound, an organic compound, or the like which has insulating properties. For example, the insulating layer 816 is formed to have a single-layer structure or a stacked-layer structure of an inorganic material or an organic material by using SOG (spin on glass), a droplet discharge method, sputtering, CVD, or the like. In addition, the insulating layer 816 is preferably formed to have a thickness of 0.75 to 3 μm.

Note that each layer (the insulating layer, the conductive layer, or the like) which forms the above-described semiconductor element may be formed to have a single-layer structure of a single material, or may be formed to have a stacked-layer structure of a plurality of materials even if there is no particular description.

In addition, the semiconductor layer included in the above-described semiconductor element can be formed using an amorphous semiconductor, a microcrystalline semiconductor, a polycrystalline semiconductor, an organic semiconductor, or the like.

For example, in order to obtain a semiconductor element having excellent characteristics, a crystalline semiconductor layer obtained by crystallizing an amorphous semiconductor layer at a temperature of higher than or equal to 200° C. and lower than or equal to 600° C. (a low temperature polysilicon layer) or a crystalline semiconductor layer obtained by crystallizing an amorphous semiconductor layer at a temperature of higher than or equal to 600° C. (a high temperature polysilicon layer) can be used. In order to obtain a semiconductor element having more excellent characteristics, it is preferable to use a semiconductor layer crystallized using a metal element as a catalyst or a semiconductor layer crystallized by laser irradiation. Alternatively, it is preferable to use a semiconductor layer formed using an $SiH_4/F_2$ gas, an $SiH_4/H_2$ gas, or the like by plasma CVD or the semiconductor layer on which laser irradiation is performed.

Further, a crystalline semiconductor layer included in the thin film transistor which is provided in the element group is preferably provided so that a grain boundary extends parallel to a direction where earners flow (a channel length direction). Such a crystalline semiconductor layer can be formed by a continuous wave laser or a pulsed laser which operates at greater than or equal to 10 MHz, preferably greater than or equal to 60 MHz and less than or equal to 100 MHz.

Furthermore, the thickness of the semiconductor layer 804 is preferably greater than or equal to 10 nm and less than or equal to 200 nm, more preferably greater than or equal to 50 nm and less than or equal to 150 nm. In particular, when a hydrogen element or a halogen element is added to a channel formation region in the semiconductor layer 804 at a concentration of greater than or equal to $1\times10^{19}$ atoms/cm$^3$ and less than or equal to $1\times10^{22}$ atoms/cm$^3$, preferably greater than or equal to $1\times10^{19}$ atoms/cm$^3$ and less than or equal to $5\times10^{20}$ atoms/cm$^3$, a semiconductor layer which has few defects and does not easily crack can be obtained.

The thin film transistor manufactured as described above has a subthreshold swing of lower than or equal to 0.35 V/dec, preferably higher than or equal to 0.09 V/dec and lower than or equal to 0.25 V/dec.

Although a thin film transistor in which a semiconductor layer, a gate insulating layer, and a gate electrode layer are sequentially stacked over a substrate (a top-gate thin film transistor) is shown in this embodiment, the present invention is not limited to this structure. A thin film transistor in which a gate electrode layer, a gate insulating layer, and a semiconductor layer are sequentially stacked in this order (a bottom-gate thin film transistor) may be used. In addition, although the N-channel transistor of this embodiment has the first N-type impurity region and the second N-type impurity region, the present invention is not limited to this. The impurity concentration of the N-type impurity regions may be uniform.

When the element group of the present invention is manufactured, a layer where the semiconductor element manufactured through the above-described step may have a stacked-layer of a plurality of films. In the case where the semiconductor element is formed to have a multi-layer structure as described above, it is preferable to use a low dielectric constant material (a low-k material) as a material of an interlayer insulating film in order to reduce parasitic capacitance between layers. Examples of such a low-k material are a resin material such as an epoxy resin or an acrylic resin, a compound material obtained by polymerization of a siloxane-based polymer, and the like. When parasitic capacitance between adjacent wirings of a multi-layer wiring structure is reduced, the small area, high speed operation, and low power consumption can be realized.

When a protective layer for preventing contamination by an alkali metal is provided, reliability of the semiconductor element is improved. This protective layer is preferably formed to cover the semiconductor element in a circuit or to cover the whole circuit using a film of an inorganic material such as aluminum nitride or silicon nitride.

A semiconductor device of the present invention has an antenna. The antenna can be formed in the same step as the semiconductor element. In this embodiment, the case where the antenna is formed in the same step as the semiconductor element is described.

First, a desired portion of the insulating layer 816 of the semiconductor element formed as described above is etched to form contact holes which expose the conductive layers 815.

Next, a conductive layer 817 which is in contact with the conductive layer 815 and functions as an antenna is formed (see FIG. 14C). The conductive layer 817 is formed using a conductive material formed to have a desired pattern, by plasma CVD, sputtering, a printing method, a droplet discharge method, or the like.

The conductive layer 817 is preferably formed to have a single-layer structure or a stacked-layer structure of an element selected from aluminum (Al), titanium (Ti), silver (Ag), or copper (Cu), or an alloy material or a compound material containing any of the above-described materials as a main component. Here, the conductive layer 817 is formed using paste containing silver by a screen printing method, and then, heat treatment is performed on the conductive layer 817 at 50 to 350° C. The conductive layer 817 may be formed in such a manner that an aluminum layer is formed by sputtering and the aluminum layer is patterned into a desired pattern. In the case of patterning the aluminum layer, wet etching is preferably used. After wet etching is performed, heat treatment is preferably performed at 200 to 300° C.

Figure 16A:
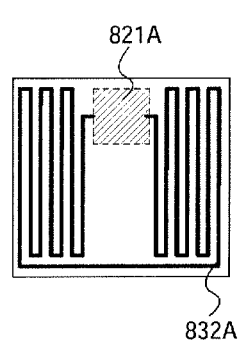
FIGS. 16A to 16C illustrate a method for manufacturing a semiconductor device of the present invention.
Figure 16B:
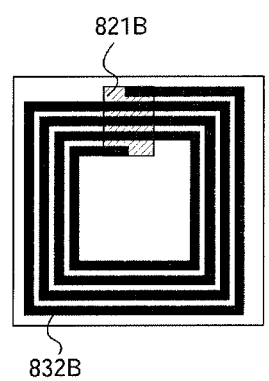
Figure 16C:
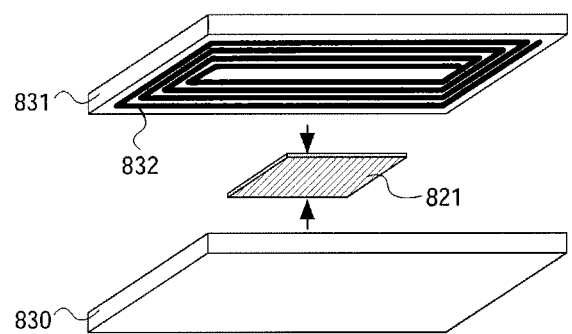

Alternatively, an antenna is formed over another substrate, and then, the antenna can be attached to the semiconductor element to be connected. For example, in a step where the semiconductor element is sandwiched above and below by the substrates, an antenna 832 is formed over one of the substrates and can be bonded to the semiconductor element to be electrically connected (see FIG. 16C). In this case, the conductive layer 817 in FIG. 14C is formed not as the antenna but as a wiring for being connected to the antenna 832.

Here, in order to connect the antenna 832 and the conductive layer 817, a bump which is connected to the conductive layer 817 is preferably formed. Further, it is preferable that a bonding layer be provided between the semiconductor element and the bump and the bonding layer be provided using an anisotropic conductive adhesive agent.

Each of an anisotropic conductive film and an anisotropic conductive adhesive agent is a material having conductivity only in a thickness direction (a perpendicular direction at the time of attachment) and is formed using an adhesive organic resin in which conductive particles having a particle size of several nm to several μm are dispersed. Examples of the organic resin are an epoxy resin, a phenol resin, and the like. In addition, the conductive particles are formed using an element or a plurality of elements selected from gold, silver, copper, palladium, or platinum. Alternatively, the conductive particles may be formed using particles having a multi-layer structure in which the above-described elements are stacked. Further alternatively, the conductive particles may be formed using conductive particles in which surfaces of particles formed using a resin are coated with a thin film formed using one or a plurality of metals selected from gold, silver, copper, palladium, or platinum.

Next, steps of separating the semiconductor element provided as described above from the glass substrate 801 and attaching it to a flexible substrate such as a film is described with reference to FIGS. 15A to 15C. In the case where the semiconductor element formed having up to the antenna is separated from the glass substrate 801 and is attached to a flexible substrate as described above, the thickness of the semiconductor element is greater than or equal to 5 μm, preferably greater than or equal to 1 μm and less than or equal to 3 μm. In addition, the area of the semiconductor element included in the element group is less than or equal to 25 mm$^2$, preferably greater than or equal to 9 mm$^2$ and less than or equal to 16 mm$^2$.

Figure 15A:
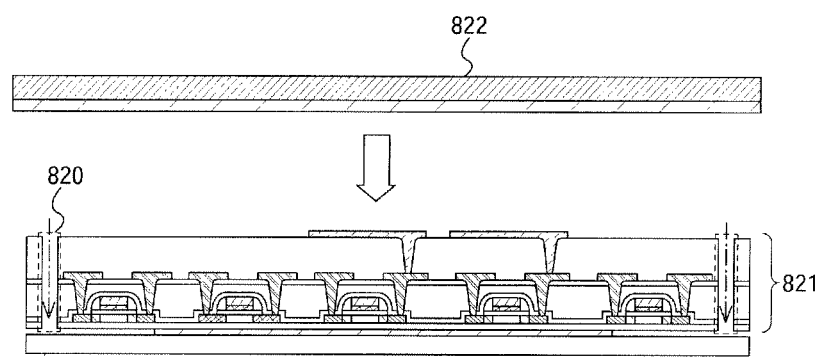
FIGS. 15A to 15C illustrate a method for manufacturing a semiconductor device of the present invention.

First, as shown in FIG. 15A, opening portions 820 are formed so that the separation layer 802 is exposed, and an etching agent is introduced into the opening portions 820 to remove the separation layer 802 partially.

Figure 15B:
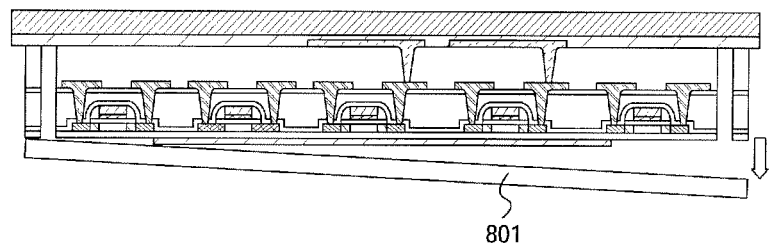

Next, when a first flexible substrate 822 is bonded from a top surface direction of the glass substrate 801 and a semiconductor element 821 is separated from the glass substrate 801 starting on the separation layer 802, the semiconductor element 821 is transferred to the first flexible substrate 822 (see FIG. 15B).

Here, as the first flexible substrate 822, a substrate in which a flexible insulating layer and a bonding layer are stacked can be used. This bonding layer is formed using a thermoplastic resin, adhesiveness of which is decreased by heat treatment, for example, a material which is softened by heating, a material with which a microcapsule which expands by heating or a blowing agent is mixed, a material in which thermofusion properties or pyrolysis properties are added to a thermosetting resin, or a material in which interface strength deteriorates due to invasion of water or a water-absorbing resin expands in accordance with invasion of water. In this specification, the first flexible substrate 822 having the flexible insulating layer and the bonding layer is also referred to as a thermal-separation support substrate.

Instead of the thermal-separation support substrate, a thermal-separation film, adhesiveness of which is decreased by heat treatment, a UV (ultraviolet) separation film, adhesiveness of which is decreased by UV (ultraviolet) irradiation, or the like may be used. A UV (ultraviolet) separation film corresponds to a film in which an insulating layer and a bonding layer, adhesiveness of which is decreased by UV (ultraviolet) irradiation, are stacked.

Figure 15C:
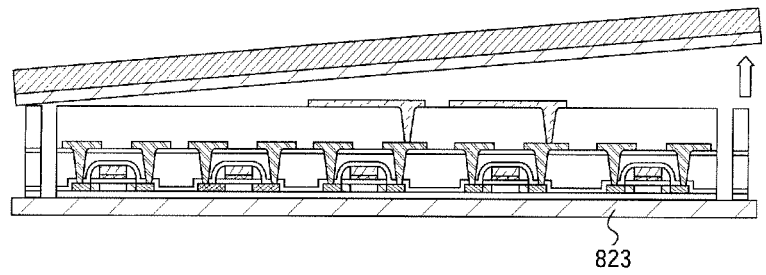

Next, a second flexible substrate 823 is bonded to a side where the semiconductor element 821 is in contact with the glass substrate 801 to separate the first flexible substrate 822 (see FIG. 15C). In addition, since the semiconductor element is exposed when the first flexible substrate 822 is separated, a flexible protection substrate may be attached in order to protect the semiconductor element.

For each of the first flexible substrate 822 and the second flexible substrate 823, a plastic film, paper, or the like can be used. In order to prevent a completed semiconductor device from being affected from outside, it is preferable that the two flexible substrates which sandwich the semiconductor element from above and below have almost the same thickness and the semiconductor element exist almost in the center.

Here, in the case where the semiconductor element 821 is attached to a flexible substrate having a curved surface or the case where the semiconductor device manufactured as described above is bent to be used, adverse effects on the semiconductor element can be reduced when a direction in which carriers of the semiconductor element flow (a channel length direction) and a direction of a curved line are the same.

In addition, although a method in which the semiconductor element 821 is transferred to the first flexible substrate 822 after the separation layer 802 is etched from the opening portions 820 is described in this embodiment, the present invention is not limited to this. For example, a method in which the semiconductor element 821 is transferred to another substrate after the separation layer 802 is removed only by etching may be used. Alternatively, a method in which the opening portions 820 are not provided and the first flexible substrate 822 is attached to separate the semiconductor element 821 from the glass substrate 801 may be used. Further alternatively, a method of polishing the glass substrate 801 from the rear surface may be used. Further alternatively, these methods may be combined as appropriate.

Since a step of transferring the semiconductor element 821 to another substrate is used except for the method of polishing the glass substrate 801 from the rear surface, the glass substrate 801 for manufacturing the semiconductor element 821 can be reused.

As described above, a thin film transistor included in each circuit which forms the element group in the semiconductor device of the present invention can be manufactured.

Note that this embodiment can be freely combined with any of Embodiment Modes 1 to 6.

Embodiment 2

In this embodiment, an example of a method for manufacturing the element group included in the semiconductor device described in any of Embodiment Modes 1 to 6, which is a different manufacturing method from that of Embodiment 1, is described. In this embodiment, a silicon on insulator (hereinafter referred to as SOI) substrate is used as a substrate, and a thin film transistor is formed using the SOI substrate.

First, an SOI substrate is prepared. Here, a substrate in which a base insulating film is formed over a support substrate and a semiconductor film is formed over the base insulating film is used. It is acceptable as long as a known SOI substrate is used as the SOI substrate, and a manufacturing method and a structure thereof are not particularly limited to certain types. Typical examples of the SOI substrate are a SIMOX substrate and an attached substrate. In addition, examples of the bonded substrate are ELTRAN®, UNIBOND®, Smart Cut®, and the like.

In the case of a SIMOX substrate, an oxygen ion is introduced into a single crystal silicon substrate and heat treatment is performed at 1300° C. or higher to form a buried oxide film (BOX) layer, so that a thin film silicon layer is formed over the surface and an SOI structure can be obtained. The thin film silicon layer is insulated from the single crystal silicon substrate by the buried oxide film layer. Further, a technique referred to as ITOX (internal thermal oxidation) in which thermal oxidation is further performed after a buried oxide film layer is formed can also be used.

In the case of an attached substrate, two single crystal silicon substrates (a first single crystal silicon substrate and a second single crystal silicon substrate) are attached with an oxide film layer interposed therebetween and one of the single crystal silicon substrates is thinned from a surface on the side which is opposite to the attached side, so that a thin film silicon layer is formed on the surface and an SOI structure can be obtained. The oxide film layer can be formed by thermal oxidation of one of the substrates (here the first single crystal silicon substrate). In addition, the two single crystal silicon substrates can be attached directly without using an adhesive agent. For example, after the oxide film layer is formed by heat treatment of the first single crystal silicon substrate, the first single crystal silicon substrate is overlapped with the second single crystal silicon substrate and thermal treatment is performed on the first single crystal silicon substrate at 800° C. or higher, preferably at approximately 1100° C., so that the two substrates can be chemically bonded to each other on an attached surface. After that, the second single crystal silicon substrate is polished from a surface on the side which is opposite to the attached side, so that the thin film silicon layer with a desired thickness can be formed. Note that a technique referred to as a Smart-Cut® method, in which without polishing the second single crystal silicon substrate after attachment, a hydrogen ion is introduced into a region at a predetermined depth in the second single crystal silicon substrate to form a minute void and growth of the minute void by heat treatment is utilized to cleave the substrate can also be used. Further, after polishing the second single crystal silicon substrate, a technique referred to as PACE (plasma assisted chemical etching) in which the substrate is etched by a small plasma etching apparatus while being locally controlled to be a thin film can also be used.

In the SOI substrate described in this embodiment, the support substrate corresponds to the single crystal silicon substrate, the base insulating film corresponds to the buried oxide film layer or the oxide film layer, and a semiconductor layer corresponds to the thin film silicon layer formed on the surface.

The thin film silicon layer corresponding to the semiconductor layer is a single crystal silicon layer. The thickness of the semiconductor layer can be selected as appropriate by controlling a condition such as the amount of polishing, the depth for ion introduction, or the like at the time of manufacturing the SOI substrate. For example, the semiconductor layer with a thickness of greater than or equal to 40 nm and less than or equal to 200 nm can be formed. In this embodiment mode, the thin film silicon layer is formed with a thickness of greater than or equal to 10 nm and less than or equal to 150 nm, preferably greater than or equal to 10 nm and less than or equal to 100 nm.

Next, the semiconductor layer is etched as selected to form an island-shaped silicon layer. At this time, the island-shaped silicon layer 106 may be formed such that an end portion has a perpendicular shape or a tapered shape. The shape of the end portion of the island-shaped silicon layer can be adjusted by changing an etching condition or the like. A taper angle of the end portion of the island-shaped silicon layer is preferably greater than or equal to 45° and less than 95°, more preferably greater than or equal to 60° and less than 95°. The end portion of the island-shaped silicon layer is formed to be almost perpendicular, so that a parasitic channel can be reduced.

The island-shaped silicon layer may have an insulating layer on the end portion. The insulating layer is formed using a material such as a silicon oxide-based material, a silicon nitride-based material, SiOF, SiOC, DLC, or porous silica by CVD or sputtering. An insulating film serving as a precursor of the insulating layer is formed so as to cover the semiconductor layer and is etched as selected by anisotropic etching, which etches mainly in a perpendicular direction. An etching method is not particularly limited to a certain method as long as anisotropic etching, which etches mainly in a perpendicular direction, can be performed. For example, reactive ion etching (RIE) can be used. Reactive ion etching is classified into a parallel-plate type, a magnetron type, a dual-frequency type, an ECR type, a helicon type, an ICP type, and the like according to a plasma generation method. As an etching gas used at this time, a gas which can obtain high etching selectivity between the insulating layer, and the substrate and the silicon layer may be selected. When the insulating layer is etched as selected, a fluorine-based gas such as $CHF_3$, $CF_4$, $C_4F_8$, $C_2F_6$, or $NF_3$ can be used, for example. Further, an inert gas such as He, Ar, or Xe, an $O_2$ gas, or an $H_2$ gas may be added as appropriate.

After that, a gate insulating layer may be formed similarly to Embodiment 1 and latter steps may be performed similarly to Embodiment 1.

When an SOI substrate is used as described in this embodiment, an element group which can perform a high speed operation and has excellent characteristics can be manufactured.

Embodiment 3

As a transistor included in the element group of the present invention, which is described in any of Embodiment Modes 1 to 6, a field effect transistor may be used. In this embodiment, a step of forming the element group of the present invention by using a field effect transistor is described with reference to FIG. 17.

Figure 17:
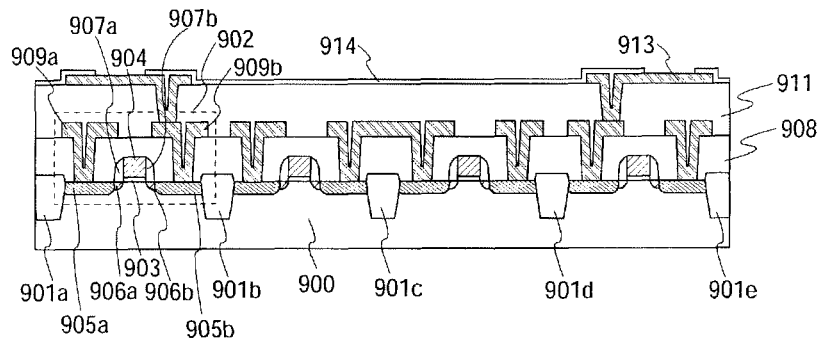
FIG. 17 illustrates a method for manufacturing a semiconductor device of the present invention.

FIG. 17 is a cross-sectional view of part of a field effect transistor which can be applied to the present invention. Element isolation regions 901a to 901e are formed over a substrate 900, and a field effect transistor 902 is formed between each of the element isolation regions 901a to 901e.

The field effect transistor 902 includes a gate insulating layer 903 formed over the substrate 900, a gate electrode layer 904 formed over the gate insulating layer 903, a source region and a drain region 905a, a source region and a drain region 905b, sidewalls 907a and 907b provided on a side of the gate electrode layer 904, an interlayer insulating layer 908 formed over the gate electrode layer 904 and the sidewalls 907a and 907b, LDD regions 906a and 906b, a source wiring and a drain wiring 909a connected to the source region and the drain region 905a, and a source wiring and a drain wiring 909b connected to the source region and the drain region 905b.

The substrate 900 is a single crystal silicon substrate or a compound semiconductor substrate, which is typically an n-type or p-type single crystal silicon substrate, a GaAs substrate, an InP substrate, a GaN substrate, a SiC substrate, a sapphire substrate, a ZnSe substrate, or the like. In this embodiment, an n-type single crystal silicon substrate is used as the substrate 900.

The element isolation regions 901a to 901e can be formed using a known selective oxidation method such as a LOCOS (local oxidation of silicon) method or an STI (shallow trench isolation) method. Here, as the element isolation regions 901a to 901e, a silicon oxide layer is formed using a trench isolation method.

The gate insulating layer 903 is formed by thermally oxidizing the single crystal silicon substrate or oxidizing the single crystal silicon substrate using high-density plasma. The gate electrode layer 904 can be formed using a polycrystalline silicon layer with a thickness of greater than or equal to 100 nm and equal to and less than 300 nm, or a stacked-layer structure in which a silicide layer such as a tungsten silicide layer, a molybdenum silicide layer, or a cobalt silicide layer is formed over a polycrystalline silicon layer. Alternatively, as the gate electrode layer 904, a tungsten nitride layer and a tungsten layer may be stacked over a polycrystalline silicon layer.

As each of the source region and the drain region 905a and the source region and the drain region 905b, an n-type high concentration impurity region where phosphorus is added to a p-well region or a p-type high concentration impurity region where boron (B) is added to an n-well region can be used. In addition, as each of the LDD regions 906a and 906b, an n-type low concentration impurity region where phosphorus is added to a p-well region or a p-type low concentration impurity region where boron (B) is added to an n-well region can be used. Here, since an n-type single crystal silicon substrate is used, a source region and a drain region formed using a p-type high concentration impurity region where boron (B) is added to the substrate and an LDD region formed using a p-type low concentration impurity region are formed.

Note that silicide such as manganese silicide, tungsten silicide, titanium silicide, cobalt silicide, or nickel silicide may be included in each of the source region and the drain region 905a and the source region and the drain region 905b. When silicide is included in surfaces of the source region and the drain region, contact resistance between the source wiring and the drain wiring and the source region and the drain region can be reduced.

The sidewalls 907a and 907b are formed by forming an insulating layer using silicon oxide over the substrate by CVD and anisotropically etching the insulating layer by RIE (reactive ion etching).

The interlayer insulating layer 908 is formed using an inorganic insulating material such as silicon oxide or silicon oxynitride or an organic insulating material such as an acryl resin or a polyimide resin. In the case of using a coating method such as spin coating or a roll coater, coating of an insulating film material dissolved in an organic solvent and heat treatment is performed thereon to form an insulating layer. Here, the interlayer insulating layer 908 is formed using silicon oxide.

Each of the source wiring and the drain wiring 909a and the source wiring and the drain wiring 909b is preferably formed using a stacked-layer structure of a low resistance material such as aluminum and a high melting point metal material such as titanium or molybdenum, for example, a stacked-layer structure of titanium and aluminum or a stacked-layer structure of molybdenum and aluminum.

In addition, an interlayer insulating layer 911 is formed over the interlayer insulating layer 908, the source wiring and the drain wiring 909a, and the source wiring and the drain wiring 909b. The interlayer insulating layer 911 is formed similarly to the interlayer insulating layer 908. Further, a conductive layer 913 connected to the field effect transistor 902 is provided over the interlayer insulating layer 911.

Further, an insulating layer 914 may be formed so as to cover part of the conductive layer 913 and the interlayer insulating layer 911. The interlayer insulating layer 911 functions as a protective layer and is preferably formed using silicon nitride, silicon oxide, silicon nitride oxide, silicon oxynitride, DLC (diamond like carbon), or the like.

The element group of the present invention is connected to an antenna. The antenna can be formed over the field effect transistor, similarly to Embodiment 1. For example, the conductive layer 913 can be used as a conductive layer functioning as the antenna. Alternatively, an insulating layer may be formed over the conductive layer 913 similarly to the interlayer insulating layer 911, and a conductive layer functioning as an antenna may be formed over the insulating layer.

Further alternatively, as described in Embodiment 1, the antenna may be formed over another substrate, and then can be attached to the substrate. As described in Embodiment 1 with reference to FIG. 16C, the antenna 832 formed over another substrate and a semiconductor element may be electrically connected. In this case, the conductive layer 913 in FIG. 17 may be used as a wiring for connecting the antenna and the semiconductor element.

As described above, an element group included in the semiconductor device of the present invention can be manufactured.

Note that this embodiment can be freely combined with any of Embodiment Modes 1 to 6 and other embodiments.

Embodiment 4

In this embodiment, an example of a method for forming part of the element group included in the semiconductor device described in any of Embodiment Modes 1 to 6 is described with reference to FIGS. 18A to 18C. In this embodiment, a method for manufacturing the MEMS structure described in Embodiment Mode 6 is briefly described.

Figure 18A:
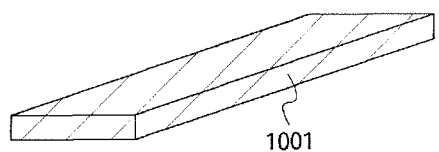
FIGS. 18A to 18C illustrate a method for manufacturing a semiconductor device of the present invention.
Figure 18B:
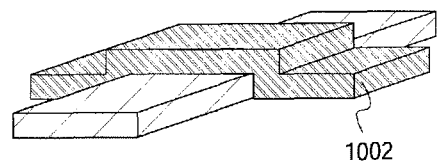
Figure 18C:
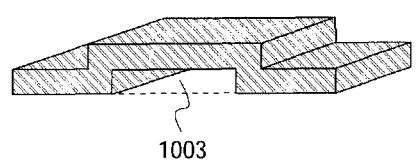

First, as shown in FIG. 18A, a sacrificial layer 1001 is formed in order to form a space of the MEMS structure. The sacrificial layer 1001 is removed later. Next, as shown in FIG. 18B, a structural layer 1002 is formed over the sacrificial layer 1001. The structural layer 1002 is formed over the sacrificial layer 1001, so that the shape of the structural layer 1002 is three-dimensional. Then, as shown in FIG. 18C, a space 1003 is formed below the structural layer 1002 when the sacrificial layer 1001 is removed by etching, and upper part of the space of the structural layer 1002 (here part over the sacrificial layer) becomes movable part.

Note that although an example of a simple structure having the structural layer 1002 and the space 1003 over the substrate is described in this embodiment, as shown in FIGS. 13A and 13B, a film serving as a base or a lower electrode may be formed over the substrate, or the sacrificial layer and the structural layer may be stacked.

Note that this embodiment can be freely combined with any of Embodiment Modes 1 to 6 and other embodiments. That is, the MEMS structure described in this embodiment can be used as a transducer by being provided over the insulating layer 914 in FIG. 17 and can be used as the element group of Embodiment Mode 1.

Embodiment 5

In this embodiment, an example of a method for manufacturing the element groups included in the semiconductor device described in any of Embodiment Modes 1 to 6 is described with reference to the drawings. In this embodiment, an example of a manufacturing method of the case of using an optical transducer as the element group is briefly described.

Figure 19A:
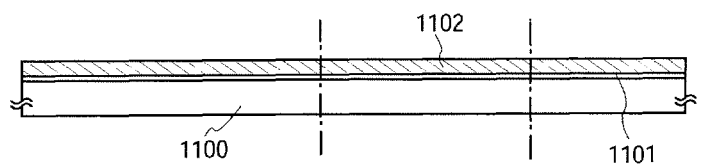
FIGS. 19A to 19E illustrate a method for manufacturing a semiconductor device of the present invention.

First, a base insulating layer 1101 and a conductive layer 1102 are formed over a substrate 1100 (see FIG. 19A). In this embodiment, a stacked-layer film of tantalum nitride with a thickness of 30 nm and tungsten with a thickness of 370 nm is used for the conductive layer 1102.

Alternatively, for the conductive layer 1102, a single-layer film formed using an element selected from titanium, tungsten, tantalum, molybdenum, neodymium, cobalt, zirconium, zinc, ruthenium, rhodium, palladium, osmium, iridium, platinum, aluminum, gold, silver, or copper, or an alloy material or a compound material containing any of the above-described elements as a main component; or a single-layer film formed using nitride of any of the above-described elements such as titanium nitride, tungsten nitride, tantalum nitride, or molybdenum nitride can be used.

Note that the conductive layer 1102 may be formed directly on the substrate 1100 without forming the base insulating layer 1101 over the substrate 1100.

Figure 19B:
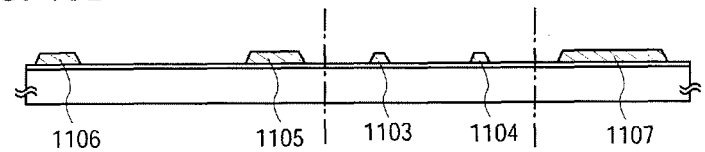
Figure 19C:
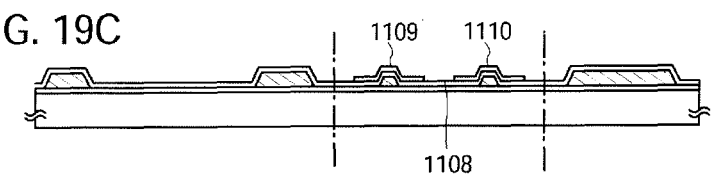

Next, the conductive layer 1102 is etched so that it has a desired pattern. Thus, a gate electrode layer 1103, a gate electrode layer 1104, a wiring 1105, a wiring 1106, and a terminal electrode 1107 are formed (see FIG. 19B).

Subsequently, a gate insulating layer 1108 which covers the gate electrode layer 1103, the gate electrode layer 1104, the wiring 1105, the wiring 1106, and the terminal electrode 1107 is formed. In this embodiment, the gate insulating layer 1108 is formed using an insulating film containing silicon as a main component, for example, a silicon oxide film containing nitrogen (the composition ratio of Si=32%, O=59%, N=7%, H=2%) formed with a thickness of approximately 115 nm by plasma CVD.

Next, an island-shaped semiconductor region 1109 and an island-shaped semiconductor region 1110 are formed over the gate insulating layer 1108. Each of the island-shaped semiconductor regions may be formed using either an amorphous semiconductor film or a crystalline semiconductor film. A method for crystallizing a crystalline semiconductor film is not particularly limited to a certain method, and a thermal crystallization method, a laser crystallization method, and the like can be used. Here, as an example, a method for adding an element which promotes crystallization to a semiconductor film is described. First, an amorphous silicon film containing an argon element which serves as a gettering site is formed to have a thickness of greater than or equal to 10 nm and equal to and less than 400 nm by sputtering. The amorphous silicon film containing an argon element is formed under an atmosphere containing argon using a silicon target. After that, the substrate over which the amorphous silicon film containing an argon element is formed is placed in a furnace heated at 650° C. and heat treatment is performed to remove a catalytic element (gettering). Thus, the catalytic element concentration in the semiconductor film having a crystalline structure is reduced. A lamp annealing apparatus may be used instead of the furnace. Next, after the amorphous silicon film containing an argon element which is a gettering site is selectively removed using a barrier layer as an etching stopper, the barrier layer is selectively removed with a diluted hydrofluoric acid. Note that since nickel has a tendency to move to a region having high oxygen concentration at the time of gettering, it is preferable to remove the barrier layer formed using an oxide film after gettering. In the case where crystallization of a semiconductor film is not performed using a catalytic element, the above-described steps such as forming the barrier layer, forming the gettering site, heat treatment for gettering, removing the gettering site, and removing the bather layer are not necessary. Subsequently, after a thin oxide film is formed on the surface of the obtained semiconductor film having a crystalline structure (e.g., a crystalline silicon film) using ozone water, a resist mask is formed using a first photomask to etch the semiconductor film to have a desired shape, so that semiconductor films which are separated into an island shape are formed.

After the island-shaped semiconductor regions are formed, the resist mask is removed. Subsequently, the island-shaped semiconductor regions are doped with a slight amount of an impurity element (e.g., boron or phosphorus) to control the threshold voltage of a thin film transistor when needed. Here, an ion doping method in which diborane ($B_2H_6$) is not mass-separated but excited by plasma is used.

Figure 19D:
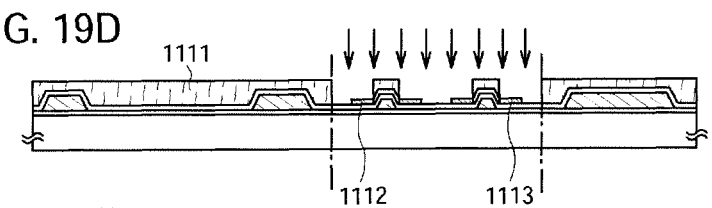

After the island-shaped semiconductor region 1109 and the island-shaped semiconductor region 1110 are formed as described above, a resist mask 1111 is formed covering portions except for regions which serve as a source region and a drain region 1112 of a thin film transistor 1119 and a source region and a drain region 1113 of a thin film transistor 1120 to introduce an impurity which imparts one conductivity type (see FIG. 19D). As the one conductivity-type impurity, phosphorus or arsenic may be used in the case of forming an n-channel thin film transistor, and boron may be used in the case of forming a p-channel thin film transistor. In this embodiment, phosphorus which is an impurity element imparting n-type conductivity is introduced into the island-shaped semiconductor region 1109 and the island-shaped semiconductor region 1110 to form the source region and the drain region 1112 of the thin film transistor 1119 and a channel formation region between these regions, and the source region and the drain region 1113 of the thin film transistor 1110 and a channel formation region between these regions. Note that the channel formation region may be doped with a slight amount of an impurity element (e.g., boron or phosphorus) to control the threshold voltage of the thin film transistor when needed.

Figure 19E:
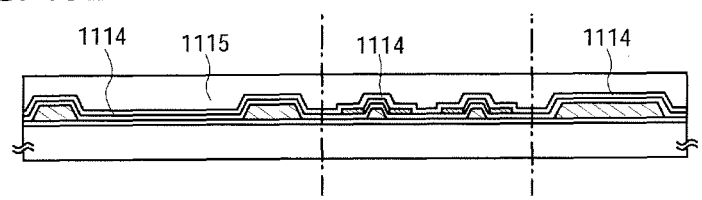

Next, the resist mask 1111 is removed to form an insulating film 1114 and an insulating film 1115 (see FIG. 19E). Here, for the insulating film 1114 and an insulating film 1115, silicon oxide, silicon nitride, an organic resin, or the like may be formed by CVD, a spin coating method, or the like.

Next, contact holes are formed in the insulating film 1114 and the insulating film 1115, a conductive film is formed, and the conductive film is etched as selected to form a wiring 1117, a connection electrode 1118, a terminal electrode 1125, a source electrode and a drain electrode 1127 of the thin film transistor 1119, and a source electrode and a drain electrode 1128 of the thin film transistor 1120. Then, the resist mask is removed. Note that the conductive film of this embodiment has a three-layer structure of a titanium film with a thickness of 100 nm, an aluminum film containing a slight amount of silicon with a thickness of 350 nm, and a titanium film with a thickness of 100 nm.

Figure 20A:
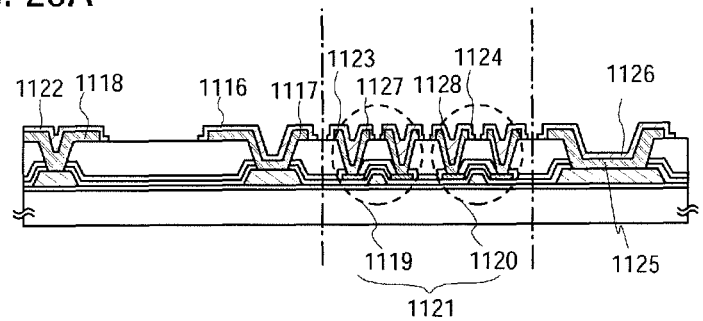
FIGS. 20A to 20C illustrate a method for manufacturing a semiconductor device of the present invention.
Figure 20B:
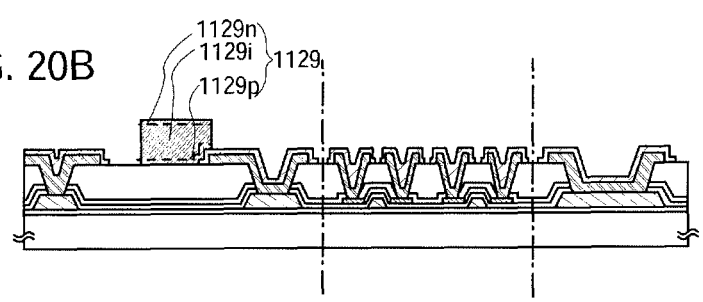
Figure 20C:
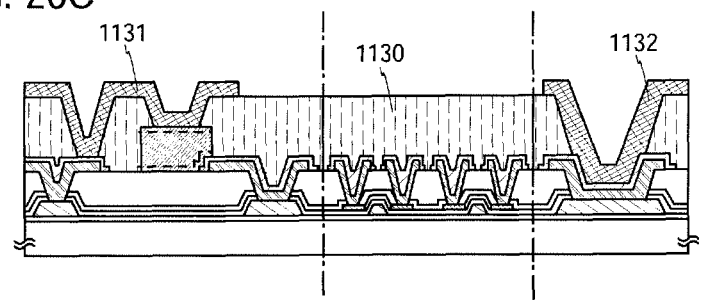

In addition, in FIGS. 20A to 20C, the wiring 1117 has a protection electrode 1116; the connection electrode 1118 has a protection electrode 1122; the terminal electrode 1125 has a protection electrode 1126; the source electrode and the drain electrode 1127 of the thin film transistor 1119 have protection electrodes 1123; and the source electrode and the drain electrode 1128 of the thin film transistor 1120 have protection electrodes 1124. However, when these electrodes are not necessary, these electrodes are not necessarily provided.

As described above, the bottom-gate thin film transistor 1119 and the bottom-gate thin film transistor 1120 can be manufactured (see FIG. 20A).

Next, a photoelectric conversion layer 1129 having a p-type semiconductor layer 1129p, an i-type semiconductor layer 1129i, and an n-type semiconductor layer 1129n is formed over the insulating film 1115 (see FIG. 20B). The semiconductor layers included in the photoelectric conversion layer are typically formed using amorphous silicon.

As the p-type semiconductor layer 1129p, an amorphous silicon film including an impurity element belonging to Group 13 (e.g., boron) may be formed by plasma CVD. Alternatively, after an amorphous silicon film is formed, an impurity element belonging to Group 13 may be introduced.

As the i-type semiconductor layer 1129i, for example, an amorphous silicon film may be formed by plasma CVD. In addition, as the n-type semiconductor layer 1129n, an amorphous silicon film including an impurity element belonging to Group 15 (e.g., phosphorous) may be formed. Alternatively, after an amorphous silicon film is formed, an impurity element belonging to Group 15 may be introduced.

After the p-type semiconductor layer 1129p is formed as described above, the i-type semiconductor layer 1129i and the n-type semiconductor layer 1129n are sequentially formed. In this manner, the photoelectric conversion layer 1129 having the p-type semiconductor layer 1129p, the i-type semiconductor layer 1129i, and the n-type semiconductor layer 1129n is formed.

In addition, each of the p-type semiconductor layer 1129p, the i-type semiconductor layer 1129i, and the n-type semiconductor layer 1129n may be formed using a semi-amorphous semiconductor film. Note that a semi-amorphous semiconductor film corresponds to a film which includes a semiconductor having an intermediate structure between an amorphous semiconductor and a semiconductor having a crystalline structure (including a single crystal and a polycrystal).

Subsequently, a sealing layer 1130, a terminal 1131, and a terminal 1132 are formed (see FIG. 20C). The terminal 1131 is connected to the n-type semiconductor layer 1129n and the terminal 1132 is formed in the same process as the terminal 1131.

Further, a substrate 1137 having an electrode 1135 and an electrode 1136 is mounted using a solder 1133 and a solder 1134. Note that the electrode 1135 on the substrate 1137 is connected to the terminal 1131 using the solder 1134 to be mounted. In addition, the electrode 1136 on the substrate 1137 is connected to the terminal 1132 using the solder 1133 to be mounted (see FIG. 21).

Figure 21:
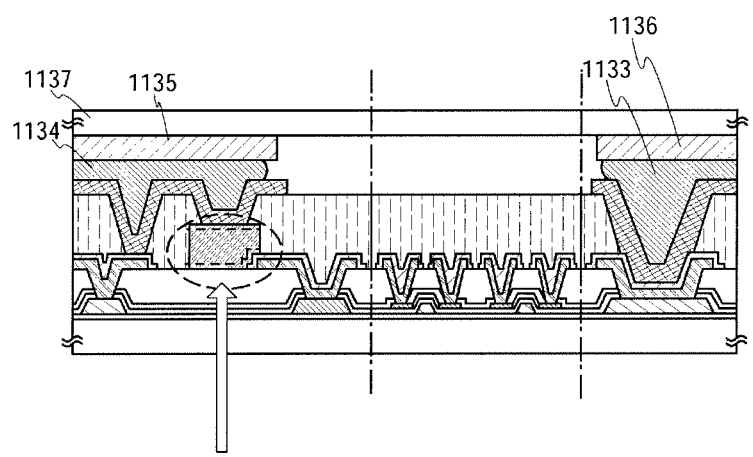
FIG. 21 illustrates a method for manufacturing a semiconductor device of the present invention.

In an element group shown in FIG. 21, it is preferable that light which enters the photoelectric conversion layer 1129 enter mainly from the substrate 1100 side. However, the present invention is not limited to this.

Note that although bottom-gate thin film transistors are used in this embodiment as an example, the present invention is not limited to this, and top-gate thin film transistors may be used.

Note that this embodiment can be freely combined with any of Embodiment Modes 1 to 6 and other embodiments. The MEMS structure described in this embodiment can be used as a transducer by being provided over the insulating layer 914 in FIG. 17 and can be used as the element group of Embodiment Mode 1.

As described above, when the element groups described in Embodiments 1 to 5 are connected to the antenna and substrates over which the element groups are provided are bonded to each other, for example, with a bonding layer interposed therebetween, a semiconductor device of the present invention can be manufactured.

This application is based on Japanese Patent Application serial no. 2007-079190 filed with Japan Patent Office on Mar. 26, 2007, the entire contents of which are hereby incorporated by reference.

What is claimed is:

1. A semiconductor device comprising:
a first substrate provided with a first element group connected to a first antenna; and
a second substrate provided with a second element group connected to a second antenna,
wherein the first element group comprises one selected from the group consisting of a thin film transistor and a field effect transistor,
wherein the second element group comprises one selected from the group of a transducer and a microactuator,
wherein the first element group and the second element group communicate with each other wirelessly through the first antenna and the second antenna, and
wherein the first substrate and the second substrate are bonded to each other.

2. A semiconductor device according to claim 1, wherein a surface on which the first element group is provided and a surface on which the second element group is provided face each other in the first substrate and the second substrate.

3. A semiconductor device according to claim 1, wherein each of the first substrate and the second substrate comprises one selected from the group consisting of a single crystal silicon substrate, a silicon compound substrate, a compound semiconductor substrate, an SOI substrate, an alkali-free glass substrate, a soda glass substrate, a quartz substrate, a plastic substrate, and a metal substrate.

4. A semiconductor device according to claim 1,
wherein the second element group includes an optical transducer, and
wherein the second substrate is a glass substrate.

5. A semiconductor device comprising:
a first substrate provided with a first element group connected to a first antenna; and
a second substrate provided with a second element group connected to a second antenna,
wherein the first element group comprises one selected from the group consisting of a thin film transistor and a field effect transistor,
wherein the second element group comprises one selected from the group of a transducer and a microactuator, wherein the first element group and the second element group communicate with each other wirelessly through the first antenna and the second antenna, and wherein the first substrate and the second substrate are bonded to each other with a bonding layer provided between the first substrate and the second substrate.

6. A semiconductor device according to claim 5, wherein a surface on which the first element group is provided and a surface on which the second element group is provided face each other in the first substrate and the second substrate.

7. A semiconductor device according to claim 5, wherein each of the first substrate and the second substrate comprises one selected from the group consisting of a single crystal silicon substrate, a silicon compound substrate, a compound semiconductor substrate, an SOI substrate, an alkali-free glass substrate, a soda glass substrate, a quartz substrate, a plastic substrate, and a metal substrate.

8. A semiconductor device according to claim 5, wherein the second element group includes an optical transducer, and wherein the second substrate is a glass substrate.

9. A semiconductor device comprising:

a first substrate provided with a first element group connected to a first antenna; and a second substrate provided with a second element group connected to a second antenna, wherein the first element group comprises one selected from the group consisting of a thin film transistor and a field effect transistor, wherein the second element group comprises one selected from the group of a transducer and a microactuator, wherein the first element group and the second element group communicate with each other wirelessly through the first antenna and the second antenna, and wherein the first substrate is bonded to a third substrate and the second substrate is bonded to the third substrate.

10. A semiconductor device according to claim 9, wherein the first substrate and the third substrate, or the second substrate and the third substrate are bonded to each other by anodic bonding or surface activated bonding.

11. A semiconductor device according to claim 9, wherein a surface on which the first element group is provided and a surface on which the second element group is provided face each other in the first substrate and the second substrate.

12. A semiconductor device according to claim 9, wherein each of the first substrate and the second substrate comprises one selected from the group consisting of a single crystal silicon substrate, a silicon compound substrate, a compound semiconductor substrate, an SOI substrate, an alkali-free glass substrate, a soda glass substrate, a quartz substrate, a plastic substrate, and a metal substrate.

13. A semiconductor device according to claim 9, further comprising a third element group provided on the third substrate, wherein the third element group is electrically connected to the first element group or the second element group.

14. A semiconductor device according to claim 9, wherein the second element group includes an optical transducer, and wherein the second substrate is a glass substrate.

* * * * *